(12) United States Patent
Daubenspeck et al.

(10) Patent No.: US 8,198,133 B2
(45) Date of Patent: Jun. 12, 2012

(54) STRUCTURES AND METHODS TO IMPROVE LEAD-FREE C4 INTERCONNECT RELIABILITY

(75) Inventors: Timothy H. Daubenspeck, Colchester, VT (US); Paul Fortier, Bromont (CA); Jeffrey P. Gambino, Westford, VT (US); Christopher D. Muzzy, Burlington, VT (US); David L. Questad, Hopewell Junction, NY (US); Wolfgang Sauter, Richmond, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 12/458,441

(22) Filed: Jul. 13, 2009

(65) Prior Publication Data
US 2011/0006422 A1    Jan. 13, 2011

(51) Int. Cl.
*H01L 21/00* (2006.01)
(52) U.S. Cl. ............... 438/108; 438/613; 438/640
(58) Field of Classification Search ............... None
See application file for complete search history.

(56) References Cited

U.S. PATENT DOCUMENTS

| | | | |
|---|---|---|---|
| 5,324,683 A | 6/1994 | Fitch et al. | |
| 5,861,678 A | 1/1999 | Schrock | |
| 5,931,685 A | 8/1999 | Hembree et al. | |
| 6,204,165 B1 | 3/2001 | Ghoshal | |
| 6,277,669 B1 | 8/2001 | Kung et al. | |
| 6,300,234 B1 | 10/2001 | Flynn et al. | |
| 6,326,698 B1 | 12/2001 | Akram | |
| 6,472,740 B1 | 10/2002 | Engel et al. | |
| 6,531,759 B2 | 3/2003 | Wachnik et al. | |
| 6,831,294 B1 * | 12/2004 | Nishimura et al. | 257/48 |
| 6,882,049 B2 | 4/2005 | Grigg | |
| 7,109,106 B2 | 9/2006 | Grigg | |
| 7,170,171 B2 | 1/2007 | Grigg | |
| 7,253,095 B2 | 8/2007 | Lur et al. | |
| 7,256,127 B2 | 8/2007 | Gallagher et al. | |
| 7,386,824 B2 | 6/2008 | Porter et al. | |
| 7,928,583 B2 * | 4/2011 | Okumura et al. | 257/778 |
| 2004/0007778 A1 * | 1/2004 | Shinozaki et al. | 257/759 |
| 2004/0253801 A1 | 12/2004 | Lin | |
| 2005/0156331 A1 | 7/2005 | Akram | |
| 2005/0227411 A1 | 10/2005 | Grigg | |
| 2006/0006480 A1 * | 1/2006 | Shinozaki et al. | 257/401 |
| 2006/0234489 A1 | 10/2006 | Wang | |
| 2007/0048896 A1 | 3/2007 | Andry et al. | |
| 2007/0114639 A1 | 5/2007 | Lin et al. | |
| 2007/0241330 A1 * | 10/2007 | Nishimura et al. | 257/48 |
| 2008/0142968 A1 * | 6/2008 | Jadhav et al. | 257/738 |
| 2009/0219069 A1 * | 9/2009 | Shinozaki et al. | 327/158 |
| 2009/0230448 A1 * | 9/2009 | Nishimura et al. | 257/296 |
| 2011/0006422 A1 * | 1/2011 | Daubenspeck et al. | 257/738 |

* cited by examiner

*Primary Examiner* — David E Graybill
(74) *Attorney, Agent, or Firm* — Richard Kotulak; Roberts Mlotkowski Safran & Cole, P.C.

(57) ABSTRACT

Controlled collapse chip connection (C4) structures and methods of manufacture, and more specifically to structures and methods to improve lead-free C4 interconnect reliability. A structure includes a ball limited metallization (BLM) layer and a controlled collapse chip connection (C4) solder ball formed on the BLM layer. Additionally, the structure includes a final metal pad layer beneath the BLM layer and a cap layer beneath the final metal pad layer. Furthermore, the structure includes an air gap formed beneath the C4 solder ball between the final metal pad layer and one of the BLM layer and the cap layer.

12 Claims, 25 Drawing Sheets

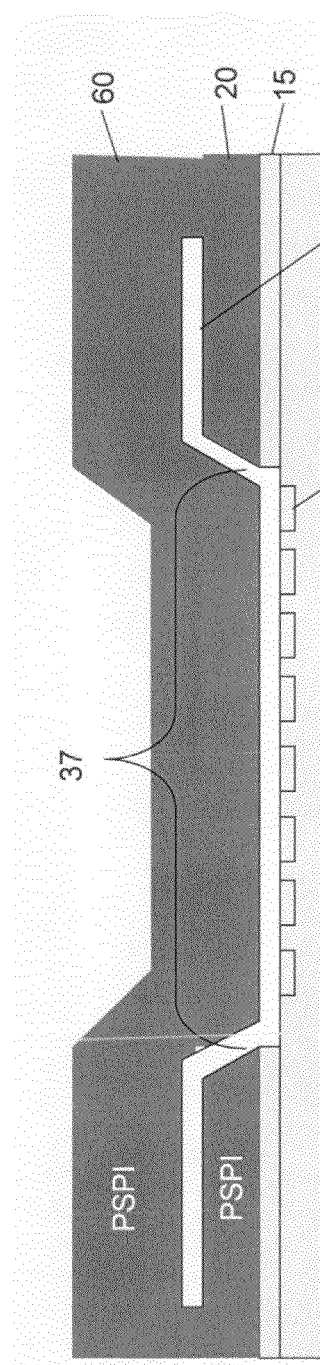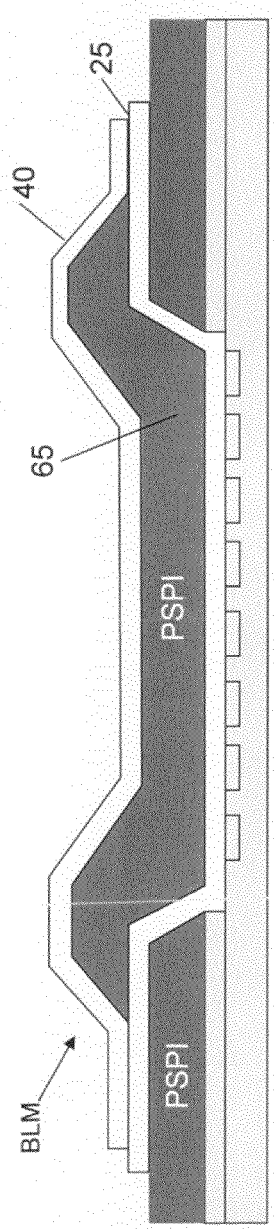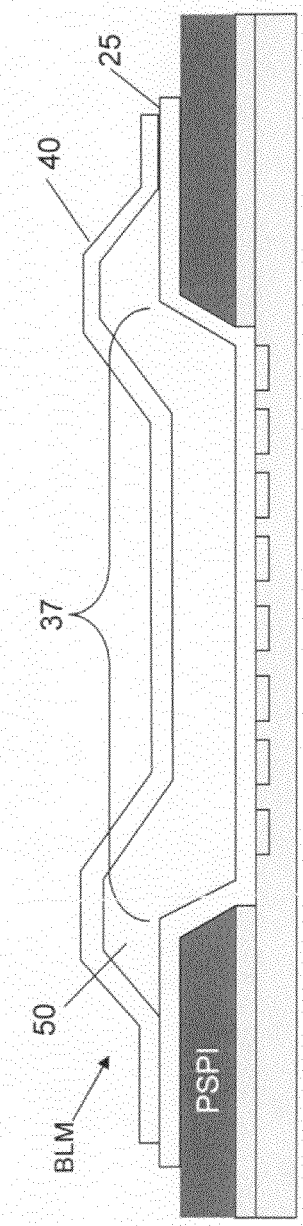

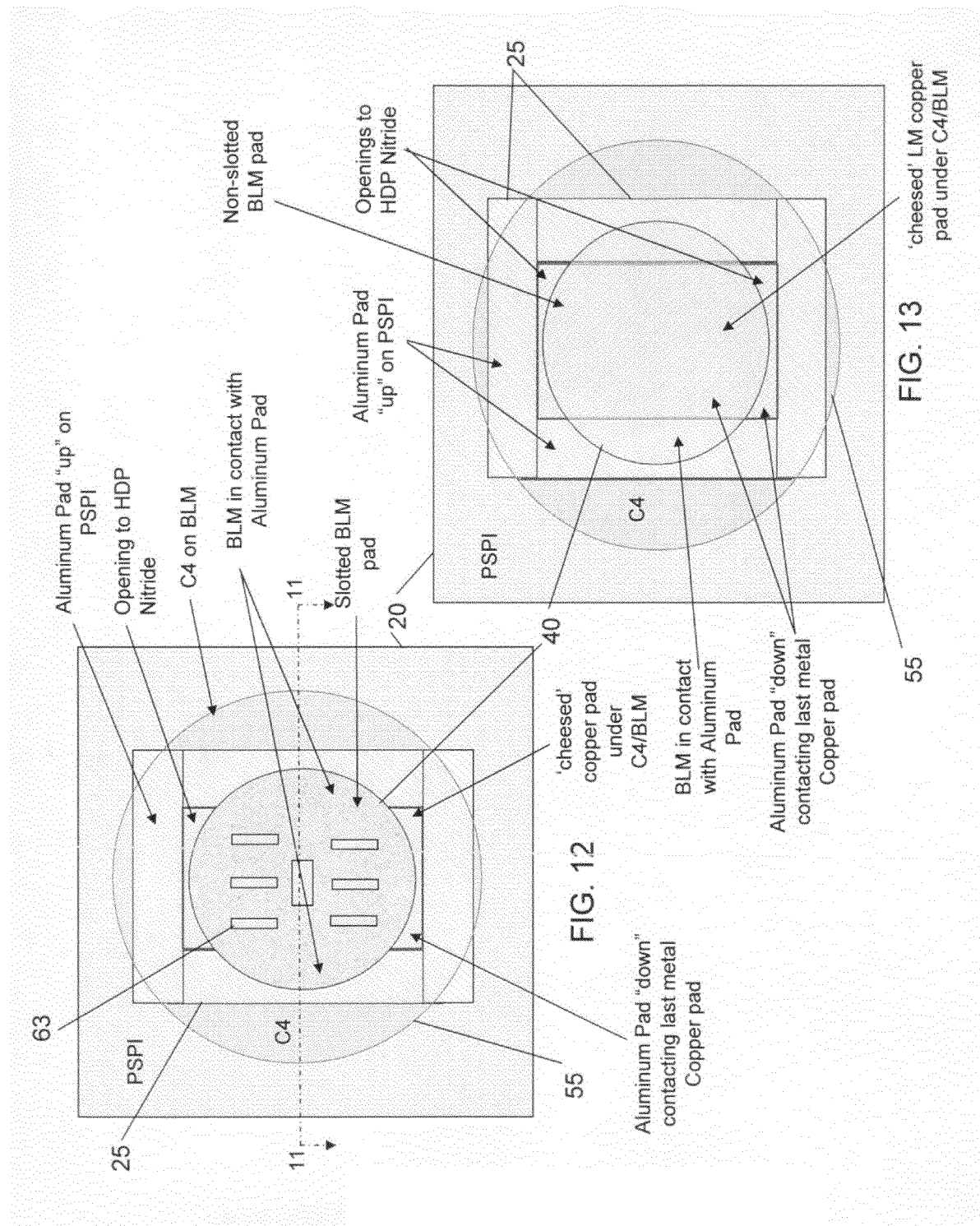

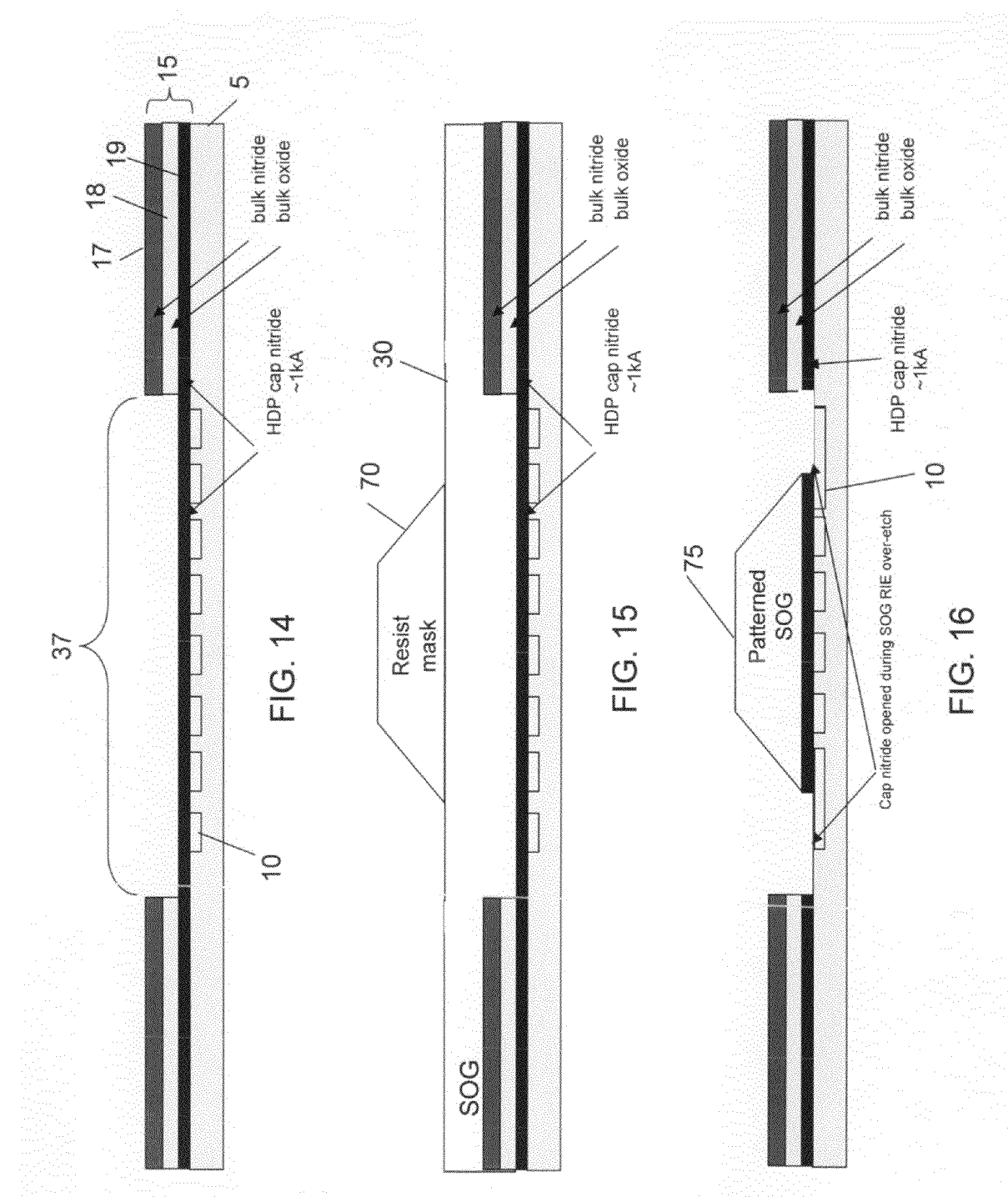

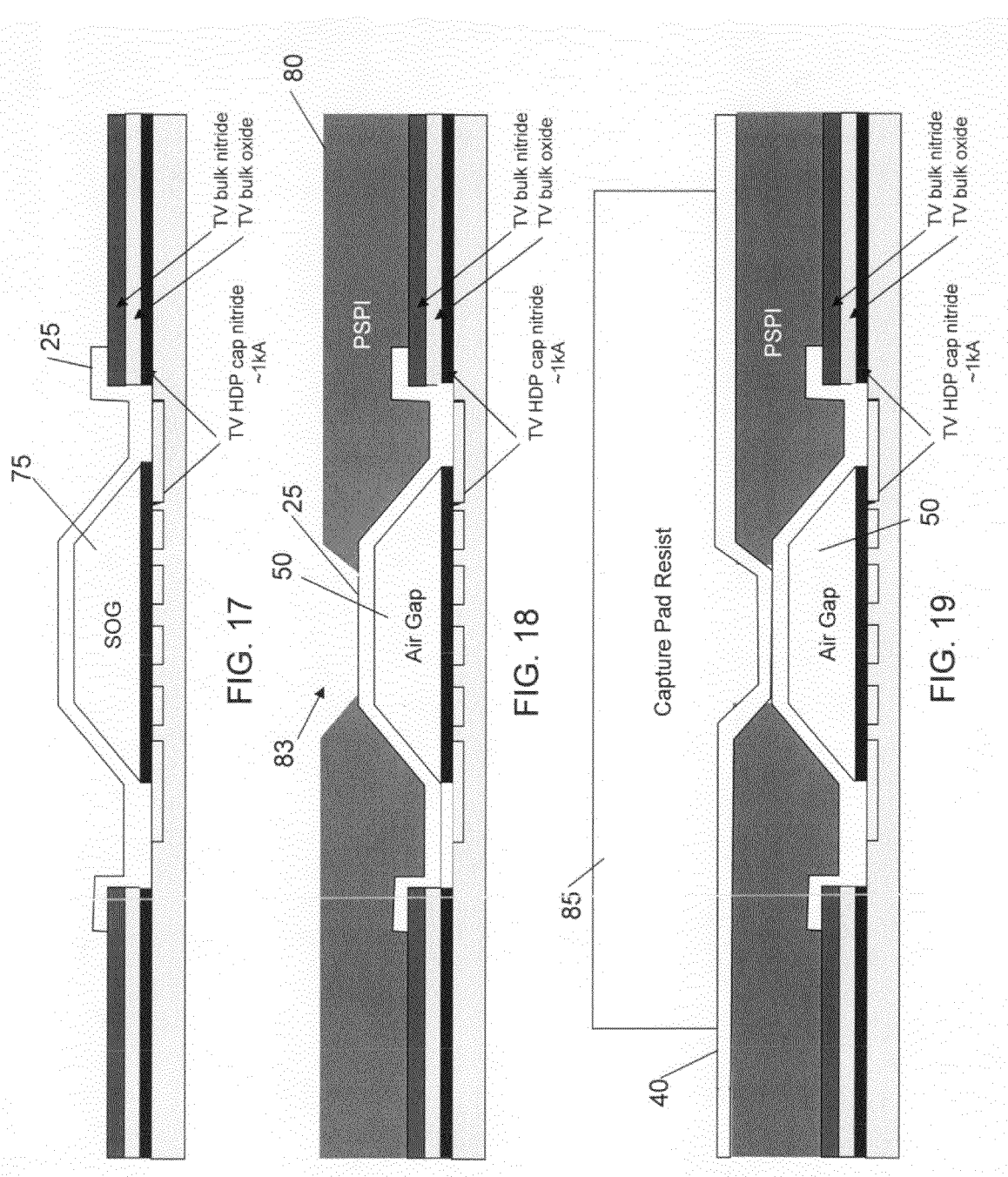

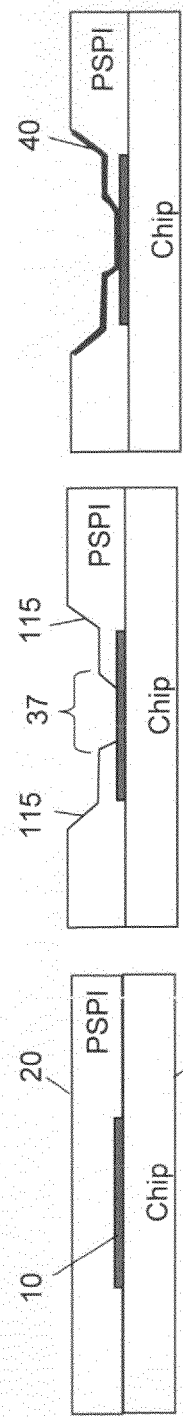
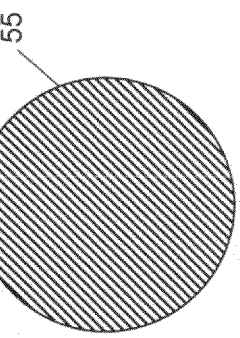
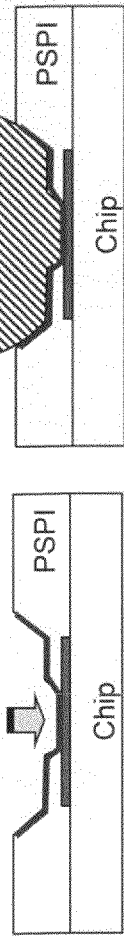
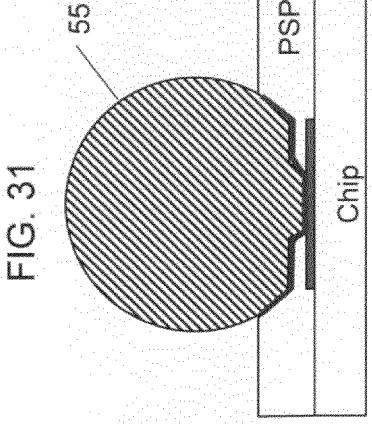
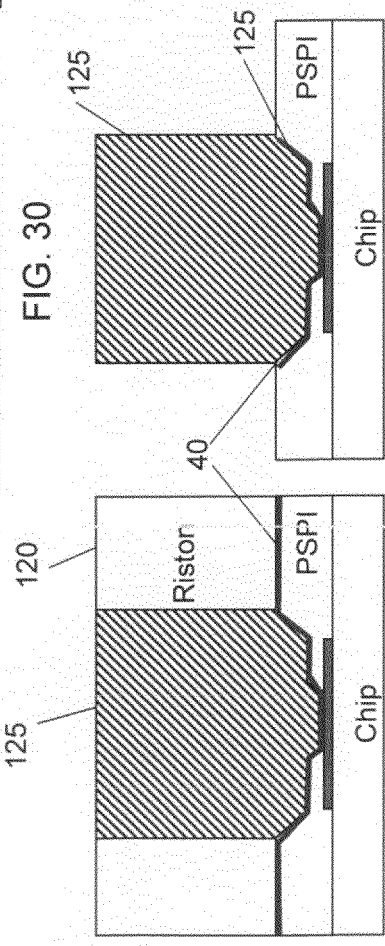

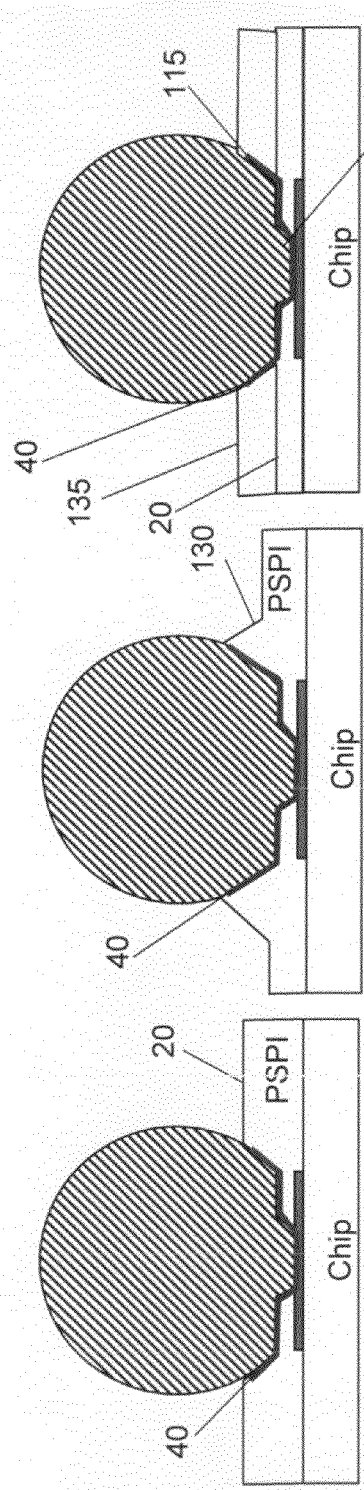

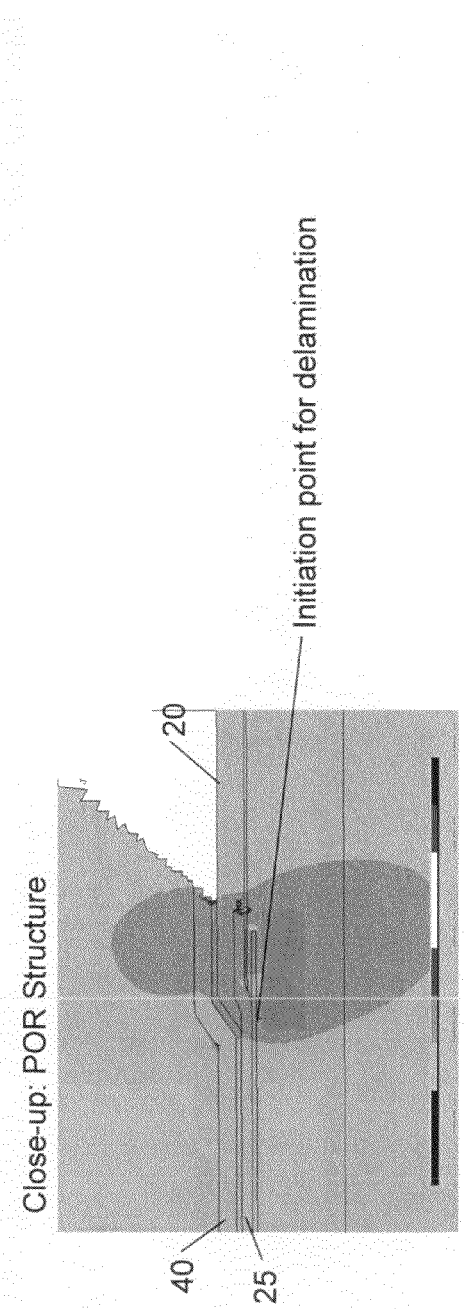
FIG. 41
FIG. 42
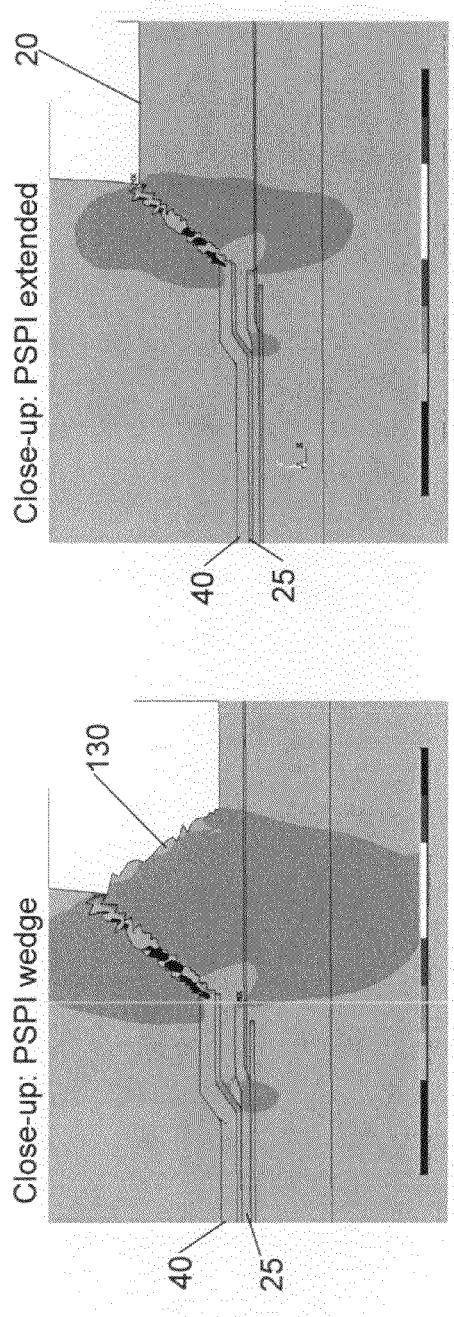
FIG. 43

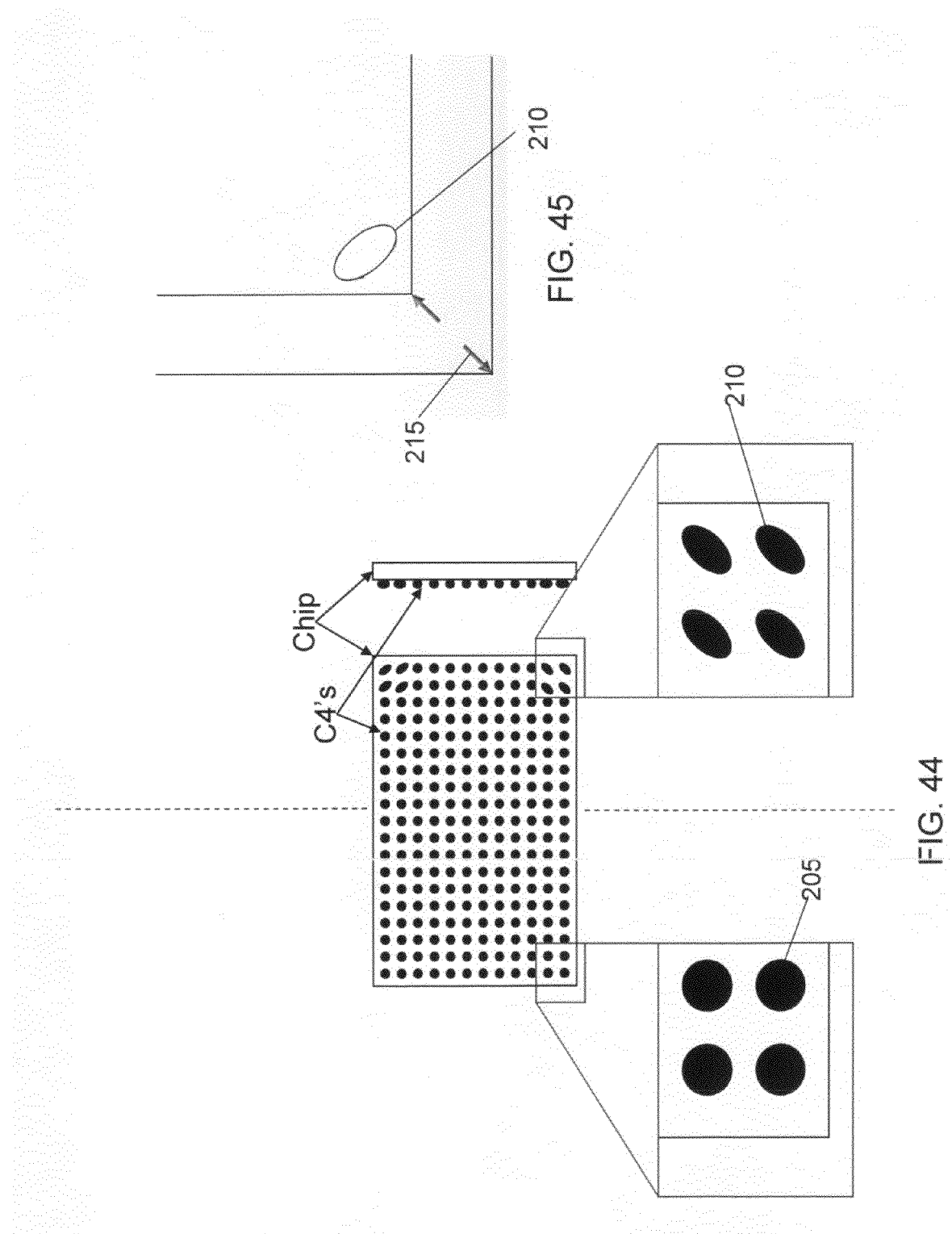

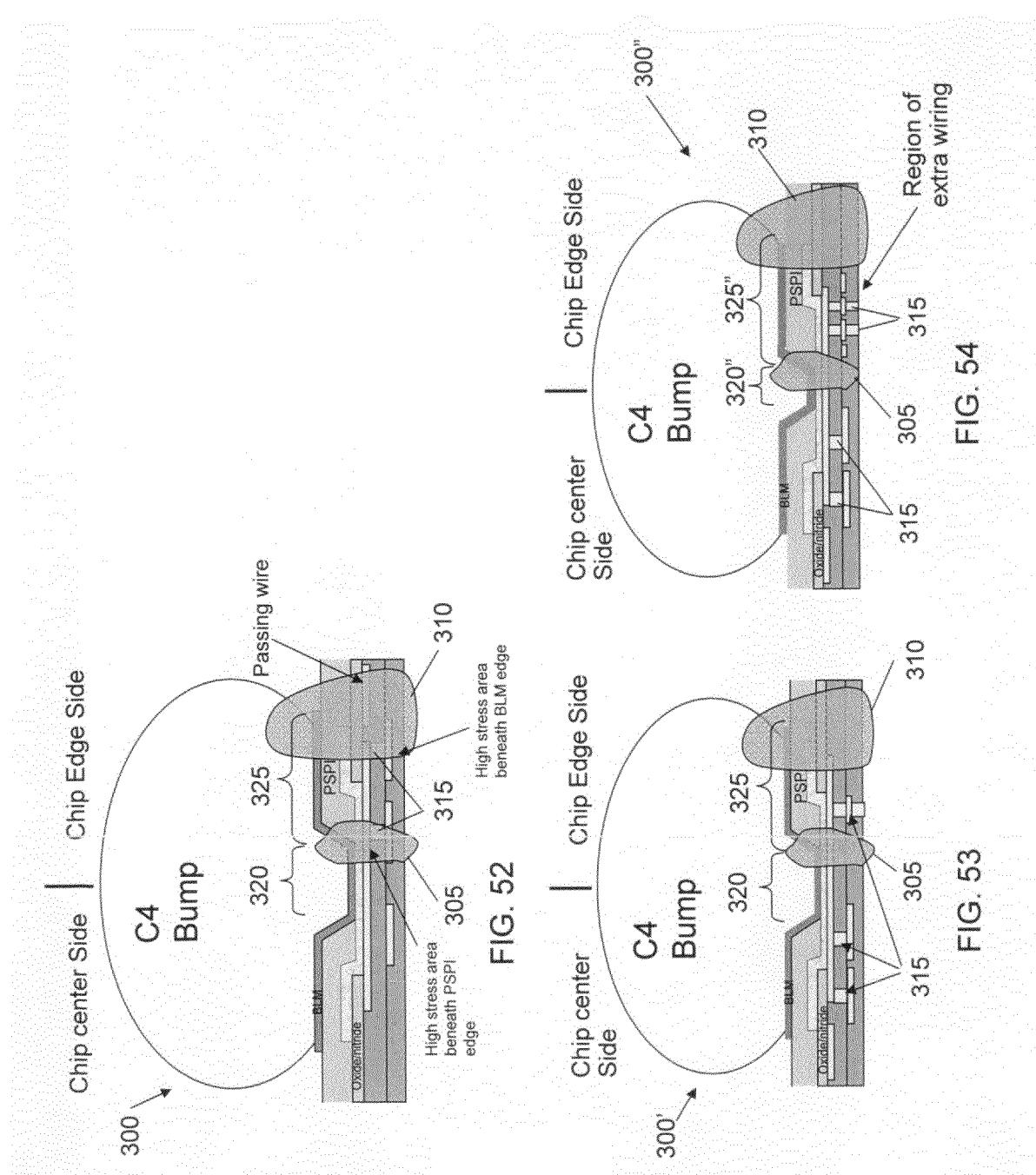

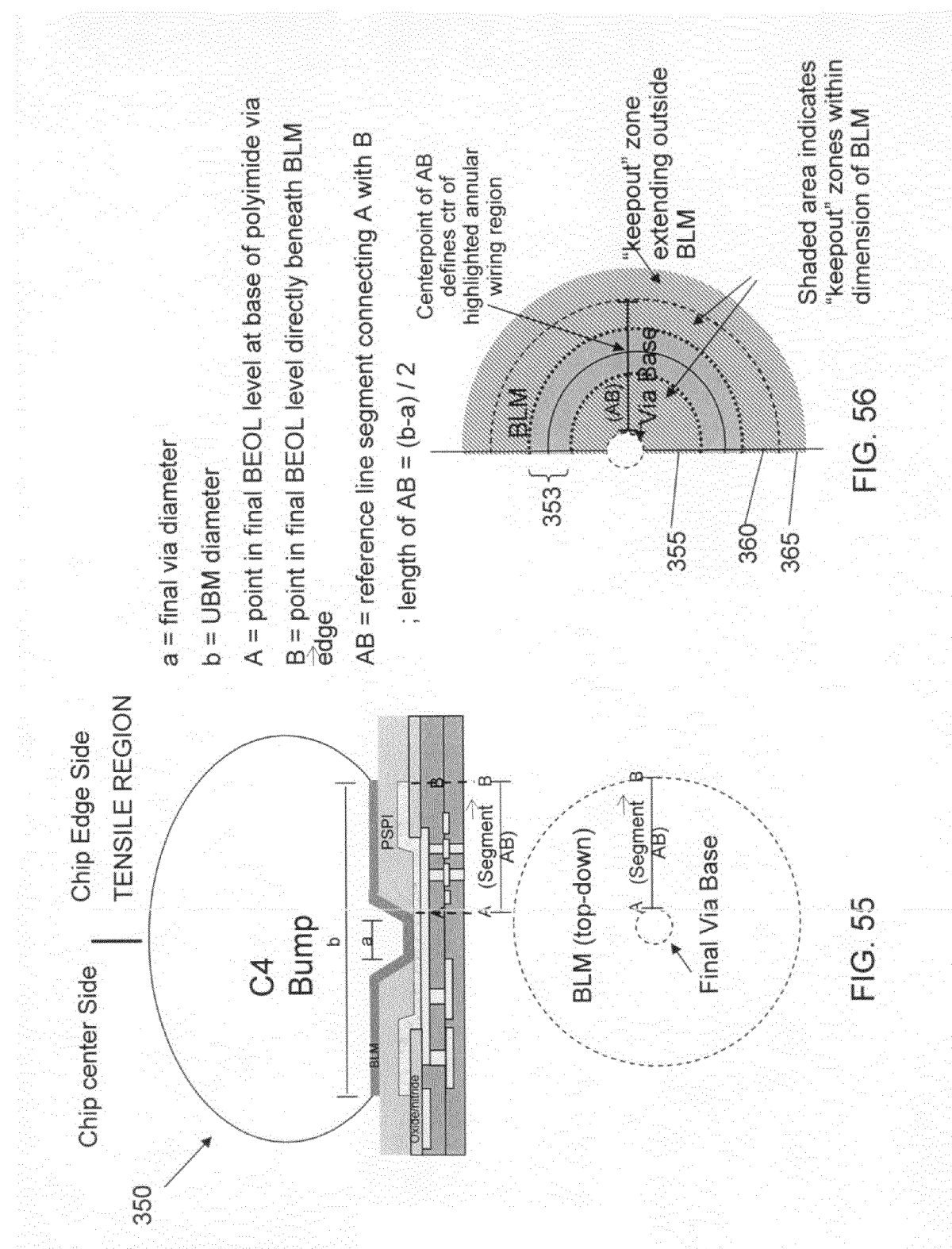

STRUCTURES AND METHODS TO IMPROVE LEAD-FREE C4 INTERCONNECT RELIABILITY

FIELD OF THE INVENTION

The present invention generally relates to structures and methods of manufacture, and more specifically to structures and methods to improve lead-free C4 interconnect reliability.

BACKGROUND

C4 (Controlled Collapse Chip Connection) interconnect reliability is a critical factor for product reliability for chips on organic substrates. However, C4s have been known to fail under certain situations. One failure mode for C4 reliability is solder fatigue due to the thermal mismatch between a chip and a laminate. For example, Pb-free C4s, when used with flipped chip plastic ball grid array (FCPBGA) organic laminate packaging, tend to transfer coefficient of thermal expansion (CTE) mismatch stresses to the underlying chip-level back end of line (BEOL). This can result in dielectric cracking and structural damage, creating a reliability risk. This chip-package interaction (CPI) issue is an emerging reliability problem being faced by integrated circuit manufacturers today.

A second failure mode affecting C4 reliability is caused by the migration to lead-free solders, which causes "white bumps." "White bumps" is a term that refers to the issue of chip cracking due to translation of vertical stresses during chip join or other thermal processing after the chip is joined to the organic laminate, in a package. More specifically, "white bumps" are a tearout of the chip BEOL metallization due to the stress that is caused by CTE mismatch between the Si chip and the organic carrier during thermal cycling. It has been found that this tearout occurs during the cooldown of the chip join reflow, where the C4 rigidly connects the chip to the carrier. White bumps present a reliability concern as the structure containing the white bumps may or may not test as electrical "open."

As an example, with larger chip sizes and organic laminate FCPBGA packages, CTE mismatch between the laminate and chip creates stresses during thermal processing that can result in chip-level cracking and film delamination. One failure mechanism is related to shear stresses at individual C4 bump sites during chip-attach processing that in turn give rise to tensile stresses of sufficient magnitude to induce cohesive or adhesive film failure directly beneath the solder ball. If the stress is allowed to exceed the strength of the chip BEOL, damage in the chip will occur. Illustratively, module level stresses may induce chip-level BEOL cracking beneath the Pb-free C4 interconnect. Once initiated, cracks can propagate laterally through proximal BEOL structures causing the "white-bumps" failure mode.

The white bump problem is particularly serious with Pb-free C4 technology, due to the stiffness of the Pb-free bump. Moreover, the white bump problem may affect corner C4's in particular. Additionally, the white bump problem is exacerbated for smaller C4's (for example with a <=150 μm pitch) due to lower chip standoff.

Accordingly, there exists a need in the art to overcome the deficiencies and limitations described hereinabove.

SUMMARY

In a first aspect of the invention, a method of making an integrated circuit (IC) packaging structure comprises forming at least one polyimide layer and etching the at least one polyimide layer to provide a final via to a metal pad and at least one supporting shoulder. Additionally, the method comprises forming a ball limited metallization (BLM) layer within the final via and at least in contact with the metal pad and portions of the at least one polyimide layer and forming a controlled collapse chip connection (C4) solder ball on the BLM layer such that the C4 solder ball is supported by the at least one supporting shoulder.

An additional aspect of the invention includes a method of designing a flipped chip plastic ball grid array structure having a plurality of ball limited metallization (BLM)-controlled collapse chip connection (C4) structures each with a final via. The method comprises using keep-out zones for wiring and via connections within back-end-of-line (BEOL) layers directly beneath a BLM edge and a final via edge on a chip-edge side of each of the plurality of BLM-C4 structures, such that the keep-out zones are devoid of wiring and via connections.

In an additional aspect of the invention, an integrated circuit (IC) packaging structure comprises a ball limited metallization (BLM) layer and a controlled collapse chip connection (C4) solder ball formed on the BLM layer. Additionally, the structure comprises a final metal pad layer beneath the BLM layer and a cap layer beneath the final metal pad layer. Furthermore, the structure comprises an air gap formed beneath the C4 solder ball and between the final metal pad layer and one of the BLM layer and the cap layer.

In a further aspect of the invention, a structure comprises a plurality of ball limited metallizations (BLMs) structured and arranged on a chip to each accommodate a controlled collapse chip connection (C4) solder ball. A dimension of a subset of the plurality of BLMs located at least at corners of the chip is smaller in a direction of a distance to neutral point (DNP) axis compared to a dimension in the direction of the DNP axis of a remainder of the plurality of BLMs of the chip, such that the C4 solder ball accommodated at one of the subset of the plurality of BLMs adopts an oval shape.

In a further aspect of the invention, an integrated circuit (IC) packaging structure, comprises a ball limited metallization (BLM) layer having a BLM perimeter, a controlled collapse chip connection (C4) solder ball formed on the BLM layer and a metal pad layer beneath the BLM layer having a metal pad layer perimeter. The metal pad layer perimeter is beyond the BLM perimeter in a direction parallel to the metal pad layer at least on a chip-edge side of the C4 solder ball.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 8-11 show exemplary processing steps and related structures in accordance with additional aspects of the invention;

FIGS. 12 and 13 show exemplary top views of C4 structures having air gaps in accordance with additional aspects of the invention;

FIGS. 14-20 show exemplary processing steps and related structures in accordance with additional aspects of the invention;

FIGS. 27-40 show exemplary intermediate processing steps and C4 structures having support shoulders in accordance with additional aspects of the invention;

FIG. 41 shows a stress plot for a POR C4 structure;

FIGS. 42 and 43 show stress plots for exemplary C4 structures having support shoulders in accordance with additional aspects of the invention;

FIG. 44 shows exemplary top and side views of a chip illustrating POR C4 structures and oval C4 structures in accordance with additional aspects of the invention;

FIG. 45 shows an exemplary top view of an elongated (or oval) C4 structure indicating an axis of sheer stress;

FIG. 52 shows a POR C4 design having vias placed in high stress regions;

FIGS. 53 and 54 show exemplary C4 structures designed to place vias beyond the high stress regions in accordance with aspects of the invention;

FIGS. 55 and 56 illustrate groundrule parameters for C4 structure design in accordance with aspects of the invention;

DETAILED DESCRIPTION

Figure 1:
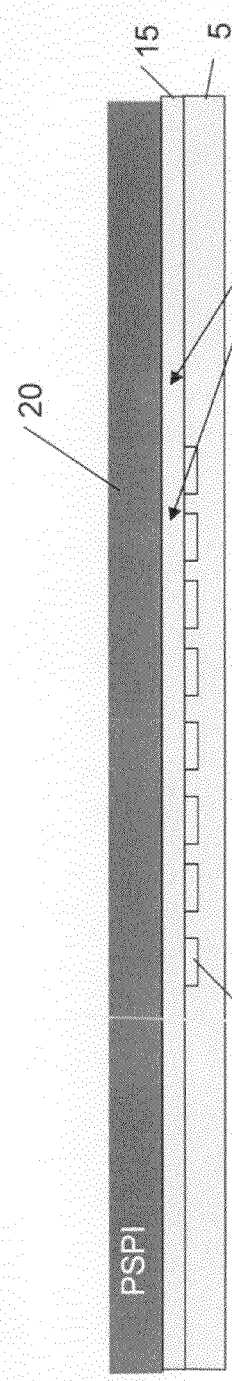
FIGS. 1-7 show exemplary processing steps and related structures in accordance with aspects of the invention.

The present invention generally relates to structures and methods of manufacture, and more specifically to structures and methods of manufacture to improve lead-free C4 interconnect reliability. By implementing one or more aspects of the present invention, CPI cracking may be prevented or reduced. Moreover, implementing the present invention will reduce or eliminate white bump formation.

CPI (chip packaging interaction) cracking is an 'integration' issue, which may be influenced by: BEOL chip level integrity; cohesivity of films; adhesivity of interfaces; chip size; final chip level pad/via module design; solder bump BLM dimension, type, and/or orientation; wafer finishing processes e.g., dicing; final chip level pad/via module design; chip-join and bond and assembly (B&A) processes; and package laminate structure, amongst other factors. For example, with C4 technology on FCPBGA, a significant reliability failure mode is tensile stress-induced breakage at C4s (for example, greater than 5 mm from DNP), which initiates on a C4 side away from chip center in response to rotational CTE stresses. This leads to breakage of underlying BEOL levels, and electrical open failure of the C4s.

In accordance with aspects of the invention, the C4 structure may be designed with features to prevent or reduce CPI cracking and the formation of white bumps. For example, in embodiments, the C4 structure may be provided with air gaps to render the C4 structure more flexible and less susceptible to CPI cracking and white bump formation. Additionally (or alternatively), the C4 structure may be formed having a sidewall support structure that renders the C4 structure less susceptible to CPI cracking and white bump formation. Furthermore, in embodiments, the C4 structure may include oval C4 solder balls to render the C4 structure more flexible and less susceptible to CPI cracking and white bump formation. According to further aspects of the invention, the C4 structure may be designed with "keep-out" zones, in which no vias or wiring is located to prevent any CPI cracking and/or white bump formation that may occur from impacting the vias or wiring. Also, in embodiments, a pad layer (e.g., aluminum pad layer) may be extended beyond the BLM pad (as viewed from above) at least in a direction towards the chip edge to prevent CPI cracking and white bump formation.

Air Gaps

According to an aspect of the invention, a C4 structure includes a pad structure (e.g., a final aluminum pad or a BLM layer) that is largely unsupported across the pad structure's breadth over an air gap, to impart flexibility (e.g., bendability) to the pad (e.g., the final aluminum pad or the BLM layer) prior to subjecting the C4 structure to the joining (or other thermal CPI) stresses that would normally result in cracking and white bumps. In embodiments, the air gap is formed between the aluminum pad layer and the ball limited metallurgy (BLM) capture pad metallization. In, another embodiment, the air gap is formed between the aluminum pad layer and the layer beneath the aluminum pad layer (e.g., the cap nitride layer). The invention comprises both a structure and process to create the structure, which comprises a "free-standing" BLM capture pad metallization film which can be incorporated into any dry C4 process technology e.g., C4NP, or any other solder placement process. The structure itself may additionally be useful with plated C4s as well.

Figure 5:
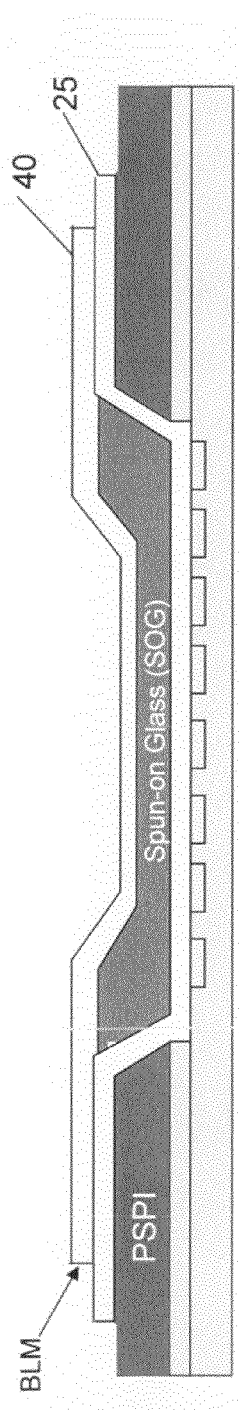
Figure 6:
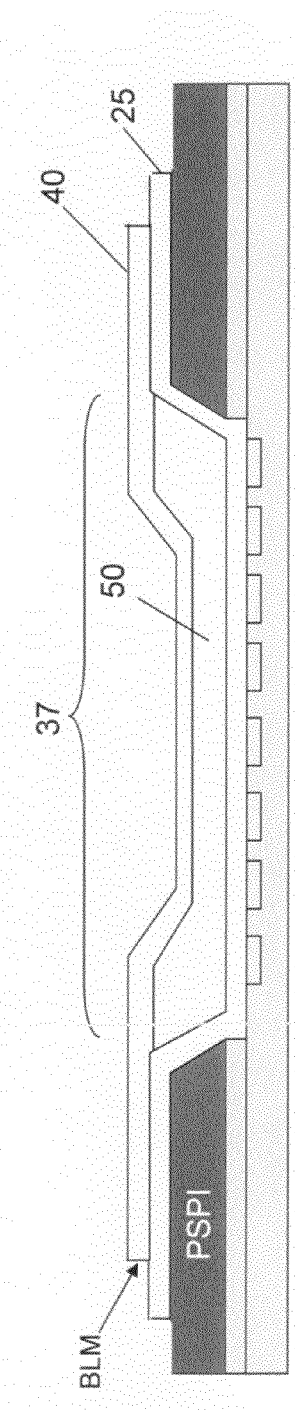
Figure 7:
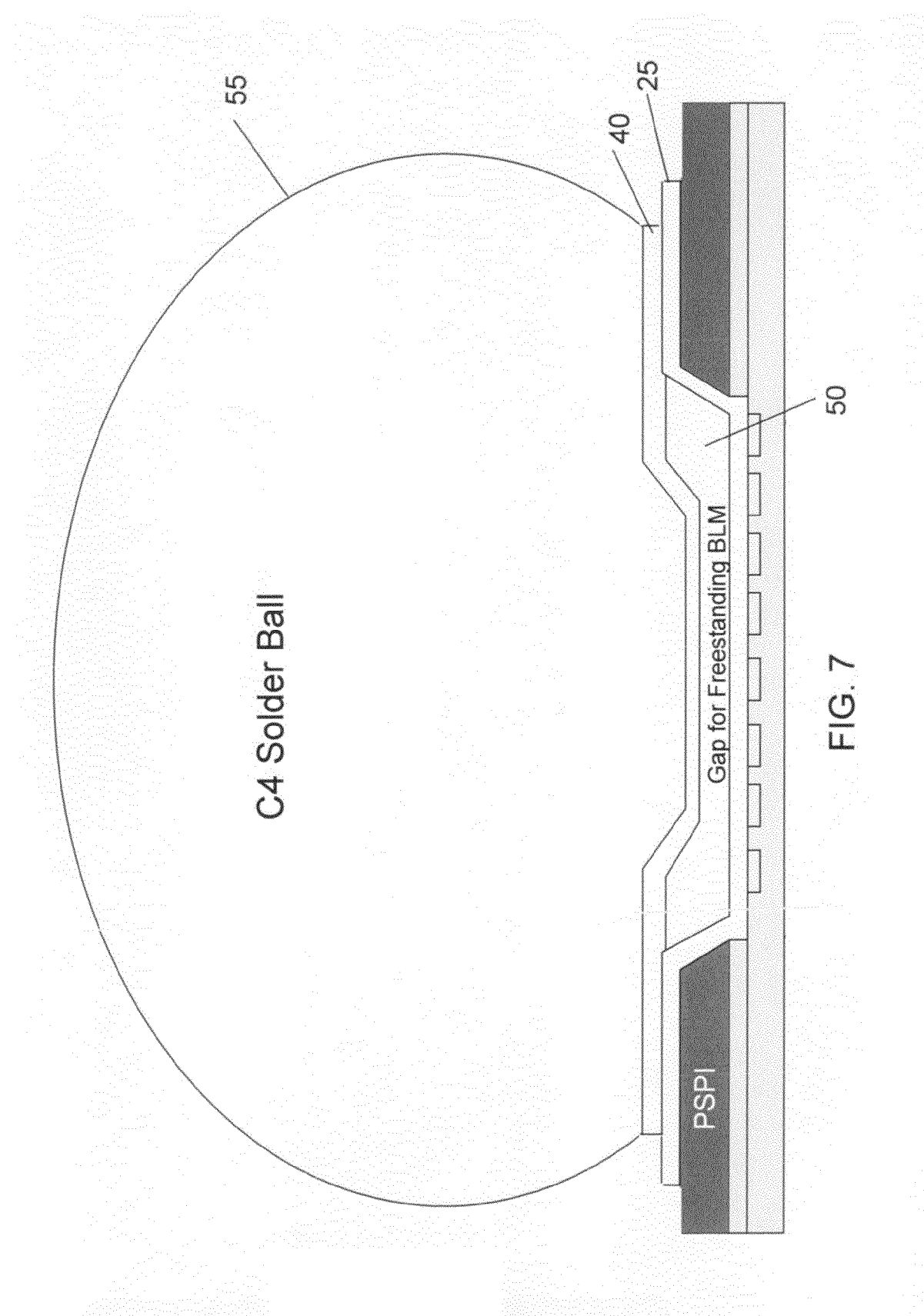

FIGS. 1-6 show intermediate processing steps and FIG. 7 shows a processing steps and C4 structure having a sturdy final BLM capture pad structure that is largely unsupported across the BLM capture pad's breadth. The final BLM capture pad structure imparts flexibility (e.g., bendability) to the pad prior to subjecting a part to the joining (or other thermal CPI) stresses that would normally result in cracking and white bumps, in accordance with an embodiment of the invention. More specifically, with the embodiment of FIGS. 1-7, an air gap is formed between the BLM capture pad and aluminum pad. In contrast to a standard process-of-record (POR) sequence of sub-pad via, pad formation, final chip level via and BLM solder pad final level processing (i.e., the formation of a C4 and BLM), which employs four masking levels, advantageously, the embodiment of FIGS. 1-7 only requires three masking levels, e.g., the through via mask, the aluminum pad mask and the BLM mask, as discussed further below.

FIG. 1 shows an intermediate structure for use with the present invention. The structure includes a copper metal level 10 formed within a dielectric layer 5 (e.g., a high dielectric insulator film or silicon dioxide). A cap layer 15 is deposited on the dielectric layer 5 and the copper level 10. In embodiments, the cap layer 15 may be, for example, a standard capping layer for a copper wiring level, e.g., a nitride film, for example, a high density plasma (HDP) nitride. Additionally, in embodiments, the cap layer 15 may be deposited using, for example, a plasma enhanced chemical vapor deposition (PECVD) process or a low pressure chemical vapor deposition (LPCVD). The HDP cap layer 15 can be either a single layer or a plurality of layers. For example, the HDP cap layer 15 may comprise a nitride layer formed over an oxide layer, which in turn is formed over a nitride cap layer. With the example of FIG. 1, the oxide layer may have a thickness of approximately 0.45 μm and the second nitride layer may have a thickness of approximately 0.40 μm, with other thicknesses contemplated by the invention.

Additionally, as shown in FIG. 1, a photosensitive polyimide (PSPI) layer 20 is applied to the cap layer 15 (e.g., spin applied). With the exemplary embodiment of FIG. 1, the thickness of the PSPI layer 20 may be approximately 9 μm, with other thicknesses contemplated by the invention. The PSPI layer 20 is exposed and baked in a conventional manner understood by those of ordinary skill in the art.

Figure 2:
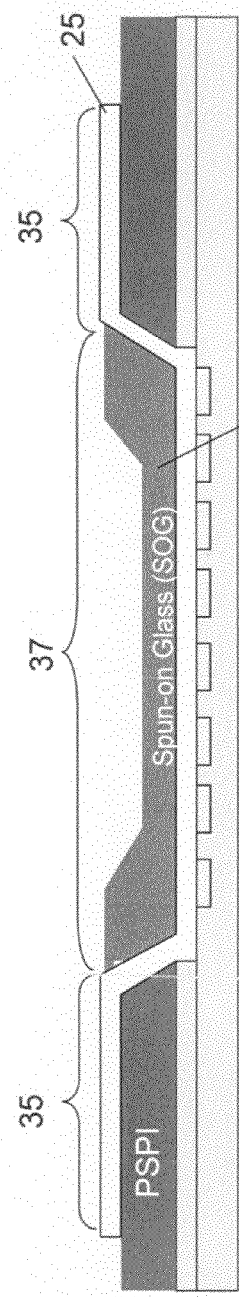

As shown in FIG. 2, the PSPI layer 20 has been developed and cured, and a pattern transfer and etch, e.g., a reactive ion etch (RIE), is performed to form an opening 37 to the last metal copper level 10 through HDP nitride cap layer 15, using conventional lithographic processes (e.g., masking with a photoresist and etching). An aluminum pad 25 is deposited over remaining portions of the PSPI layer 20 and the last copper layer 10 within the opening 37, e.g., using a physical vapor deposition (PVD) process, followed by a stripping of the resist mask and a cleaning.

As further shown in FIG. 2, a spun-on glass (SOG) layer 30 is formed on the aluminum pad 25. In embodiments, the thickness of the SOG layer 30 may be approximately 2-5 μm, with other thicknesses contemplated by the invention. The SOG layer 30 is then planarized, e.g., using a chemical mechanical polishing/planarization (CMP) process, to remove SOG over "portions" 35 of the aluminum pad 25 (on the PSPI layer 20) and the PSPI layer 20. This process leaves the SOG layer 30 filling the aluminum pad-covered opening 37. The SOG layer 30 has a shape that can be controlled with a CMP process, such that the shape is, e.g., recessed (as shown), raised and/or tapered, etc.

Figure 3:
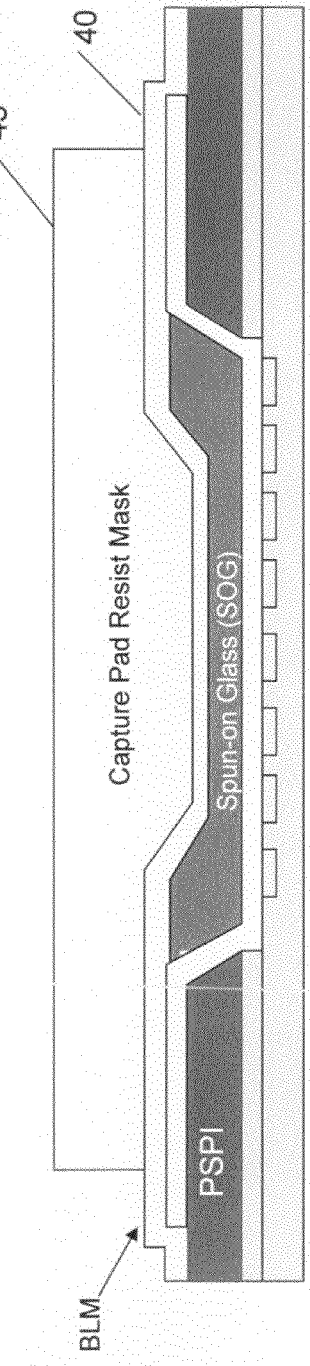

As shown in FIG. 3, a capture pad ball limited metallization (BLM) 40 (also called an under bump metallurgy (UBM)) is deposited, for example, using standard PVD process (e.g. TiW/Cu/Ni) over the structure shown in FIG. 2. A capture pad resist mask 45 (e.g., a block mask resist) is applied to the BLM 40 to define a BLM capture pad shape.

Figure 4:
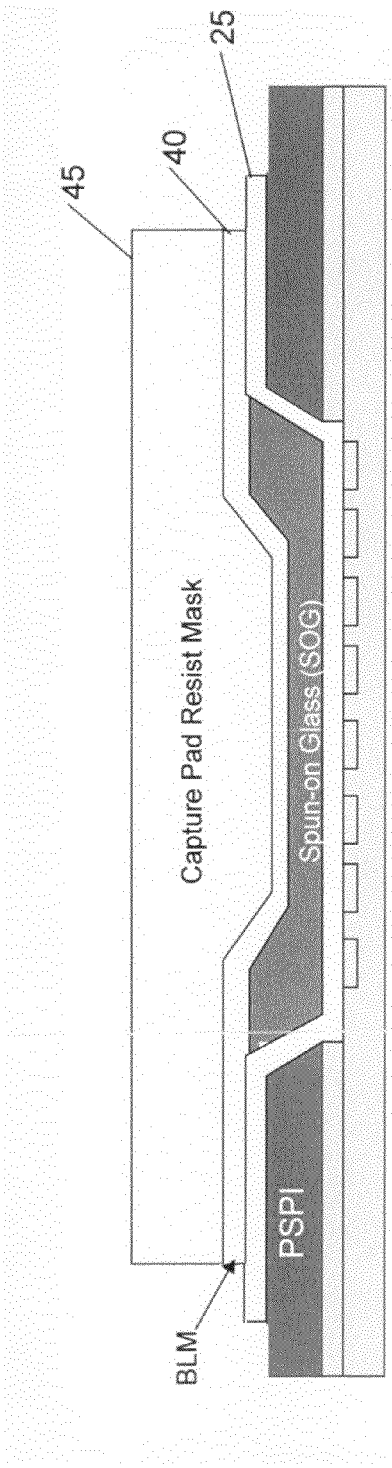

As shown in FIG. 4, the capture pad resist mask 45 is transferred to BLM 40, e.g., using a standard capture pad wet etch process. As shown in FIG. 4, the portions of the BLM 40 beyond the capture pad resist mask 45 have been removed by the etch process. As shown in FIG. 5, the capture pad resist mask 45 is stripped using conventional processes.

As shown in FIG. 6, an SOG wet etch process is performed to remove the SOG beneath the BLM 40 to form a gap 50. In accordance with aspects of the invention, the wet etch has access to SOG by utilizing a capture pad resist mask 45 that is smaller than the opening 37 on, for example, two sides (as shown in FIGS. 12 and 13 discussed further below). Additionally (or alternatively), in embodiments, the BLM 40 may be designed having slotted openings, through which the SOG may be etched and removed, which is also discussed further below.

As shown in FIG. 7, a C4 Pb-free solder bump 55 is placed, e.g., deposited, on the freestanding BLM 40. In this embodiment, the gap 50 is under the C4 Pb-free solder bump 55 between the BLM 40 and the aluminum pad 25.

Figure 11:
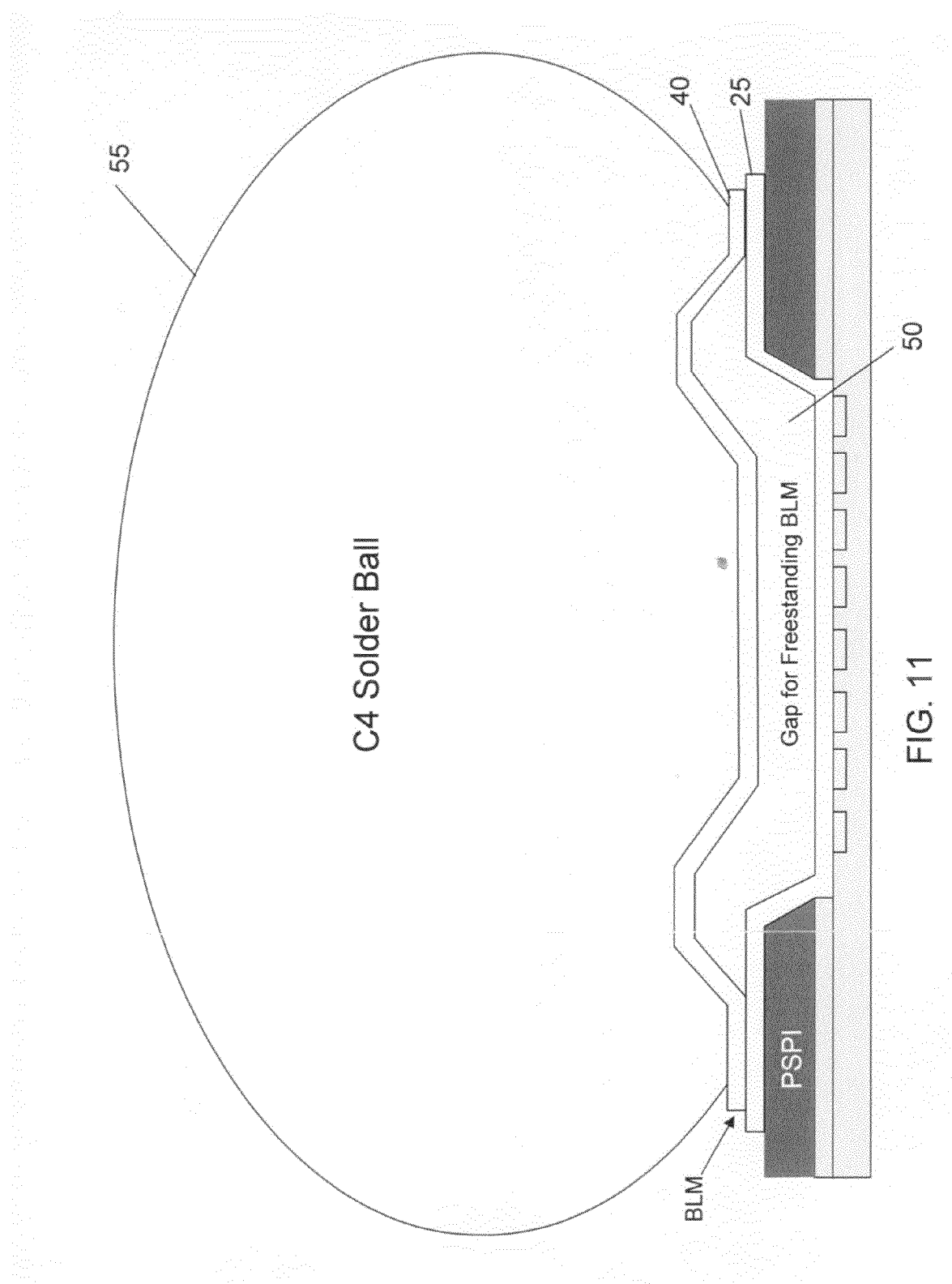

FIGS. 8-10 show intermediate processing steps and related structures and FIG. 11 shows a C4 structure and processing steps resulting in a sturdy final aluminum pad structure that is largely unsupported across the final aluminum pad structure's breadth over an air gap. With the embodiment of FIGS. 8-11, an air gap is formed between the BLM capture pad and aluminum pad. The air gap imparts flexibility (e.g., bendability) to the pad prior to subjecting a part to the joining (or other thermal CPI) stresses that would normally result in cracking and white bumps, in accordance with an embodiment of the invention. Moreover, with the embodiment of FIGS. 8-11, a second PSPI layer is utilized instead of the SOG layer 30 utilized in the embodiment of FIGS. 1-7.

As shown in FIG. 8, the PSPI layer 20 is developed and cured and a pattern transfer and etch, e.g., a reactive ion etch (RIE), is performed to form an opening 37 to the metal copper level 10 through the HDP nitride cap layer 15, using conventional lithographic processes (e.g., masking with a photoresist and etching). An aluminum pad 25 is deposited over portions of the PSPI layer 20 and the last copper layer 10 within the opening 37, e.g., using a physical vapor deposition (PVD) process, followed by a stripping of the resist mask (not shown) and a cleaning.

As further shown in FIG. 8, a second PSPI layer 60 is formed on the aluminum pad 25 and portions of the PSPI layer 20. In embodiments, the thickness of the second PSPI layer 60 may be approximately 9 μm, with other thicknesses contemplated by the invention.

As shown in FIG. 9, the second PSPI layer 60 is then exposed and developed to form PSPI block 65 over the aluminum pad 25 for BLM support. The second PSPI layer 60 can be controlled, such that the shape of the PSPI block 65 is, e.g., recessed, raised (as shown), and/or tapered, etc. Additionally, the PSPI block 65 is partially cured to hold its form, while retaining solubility for subsequent removal by solvent (e.g., a warm NMP or equivalent). Further, as shown in FIG. 9, a capture pad ball limited metallization (BLM) 40 is deposited, for example, using standard PVD process (e.g. TiW/Cu/Ni) over the PSPI block 65 and portions of the aluminum pad 25. A capture pad resist mask, e.g., a block mask resist, (not shown) is applied to the BLM 40 to define a BLM capture pad shape.

As shown in FIG. 10, a PSPI solvent removal or wet-etch process is performed to remove the PSPI block 65 beneath the BLM 40. This process forms a gap 50. In accordance with aspects of the invention, the wet etch has access to the PSPI block 65 by utilizing a capture pad resist mask (not shown in FIGS. 8-10) that is smaller than the opening 37 on, for example, two sides (as shown in FIGS. 12 and 13 discussed further below). Additionally (or alternatively), in embodiments, the BLM 40 may be designed having slotted openings, through which the PSPI block 65 may be etched and removed, which is also discussed further below.

As shown in FIG. 11, a C4 solder bump 55 is placed on the freestanding BLM structure 40 of FIG. 10. More specifically, the C4 solder bump 55 is deposited in the freestanding BLM structure 40, and is over the gap 50. The process may include using, e.g., a C4NP transfer process, understood by those having ordinary skill in the art.

FIGS. 12 and 13 show top views of C4 structures in accordance with aspects of the invention. As can be observed, FIG. 12 includes section line 11-11, indicating the view of FIG. 11 relative to the view of FIG. 12. As discussed further below, the embodiment of FIG. 12 includes a slotted BLM pad 40 to assist in the removal of SOG and/or PSPI to create the gap 50. In the embodiment of FIG. 12, the SOG and/or PSPI may be removed through the slots 63 in the BLM pad 40 and/or through the openings to the HDP nitride on the two sides (top and bottom as shown in FIG. 12) of the BLM pad 40.

In contrast, the embodiment of FIG. 13 does not include a slotted BLM pad 40. Instead, with the embodiment of FIG. 13, the SOG and/or PSPI may be removed through the openings to the HDP nitride on the two sides (top and bottom as shown in FIG. 13) of the BLM pad 40. Moreover, as should be understood, these openings are along a z-axis which extends perpendicularly into the page of FIG. 11.

As discussed with reference to FIG. 4, the BLM capture pad mask 45 should be smaller than opening mask image (used to form the opening 37 shown in FIG. 2) on, for example, two sides of the opening mask image. With such an arrangement of the respective masks as shown in FIG. 12, the BLM capture pad 40 is formed smaller, e.g., on two sides as compared to the opening to the nitride layer to allow for clean-out of material (e.g., SOG and/or PSPI). The openings to the HDP nitride are located between the regions where the aluminum pad 25 is up on the PSPI layer 20 and the bottom of the BLM 40, e.g., the area where the aluminum pad 25 is down on the copper pad 10 and not on the PSPI layer 20, i.e., the down areas indicated in FIG. 12. Additionally, as noted above, the embodiment of FIG. 12 includes a slotted BLM pad 40 having slots 63. The slots 63 additionally allow for clean-out of material (e.g., SOG and/or PSPI).

With the exemplary embodiment of FIG. 13, the clean-out of material (e.g., SOG and/or PSPI) occurs through the above-described openings to the HDP nitride. Additionally, while each of the exemplary embodiments of FIGS. 12 and 13 include the above-described openings to the HDP nitride to allow for the clean-out of material (e.g., SOG and/or PSPI), the invention contemplates that removal of the material (e.g., SOG and/or PSPI) may occur through slots 63 in a BLM pad 40 alone. That is, the invention contemplates that, in embodiments, the BLM capture pad mask 45 is not smaller than the opening mask image (used to form the opening 37) on any sides of the opening mask image. With such an arrangement, no openings to the HDP nitride are provided e.g., on the two sides, and the clean-out of material (e.g., SOG and/or PSPI) only occurs through the slots of the BLM pad.

Figure 20:
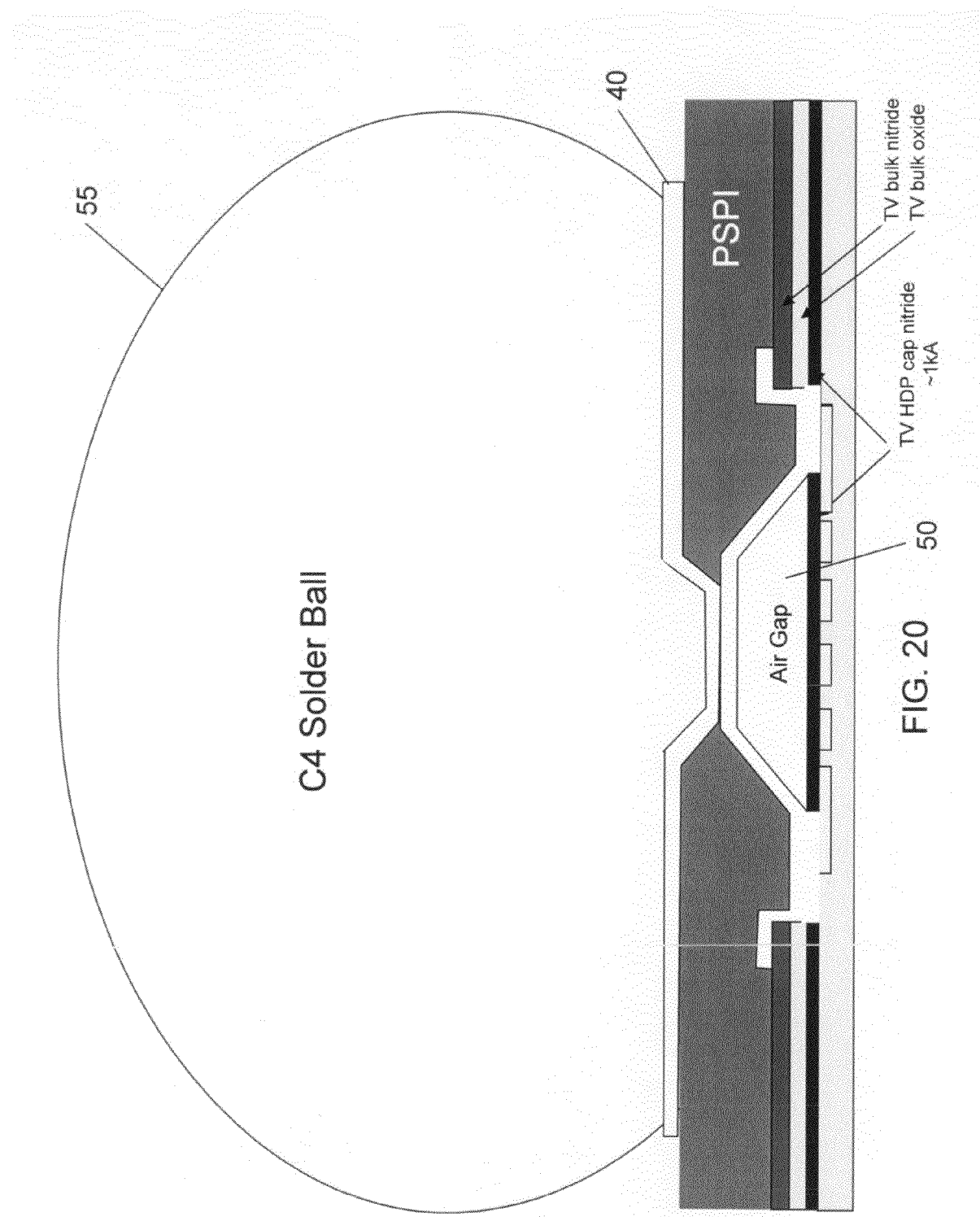

FIGS. 14-19 show intermediate processing steps and FIG. 20 shows processing steps and a C4 structure resulting in a sturdy final aluminum pad structure that is largely unsupported across the pad structure's breadth over an air gap. In accordance with an embodiment of the invention, the air gap imparts flexibility (e.g., bendability) to the pad prior to subjecting the structure to the joining (or other thermal CPI) stresses that would normally result in cracking and white bumps.

FIG. 14 shows an intermediate structure for forming the present invention. The structure includes a copper metal level 10 formed within a dielectric layer 5 (e.g., a high dielectric insulator film or silicon dioxide). A high density plasma (HDP) cap layer 15 is deposited on the dielectric layer 5. The HDP cap layer 15 may comprise a bulk nitride layer 17, a bulk oxide layer 18 and a cap nitride layer 19. With the example of FIG. 14, the bulk oxide layer 18 may have a thickness of approximately 0.45 μm and the bulk nitride layer 17 may have a thickness of approximately 0.40 μm, with other thicknesses contemplated by the invention. Additionally, as shown in FIG. 14, a pattern transfer and etch, e.g., a reactive ion etch (RIE), is performed to form an opening 37 to the cap nitride layer 19.

As shown in FIG. 15, an SOG layer 30 is applied over the structure of FIG. 14 including within the opening 37. An SOG resist mask 70 is formed over the SOG layer 30 and is exposed and developed in a conventional manner using lithographic processes well understood by those of ordinary skilled in the art.

As shown in FIG. 16, a pattern-transfer etch process, e.g., an RIE process, is performed to shape the SOG layer 30 to form an SOG block 75. This process also etches open portions (e.g., overetch) of the HDP nitride cap layer 19 to expose copper pad 10. As shown in FIG. 17, an aluminum pad 25 is formed over the SOG block 75, the exposed copper pad 10 and portions of the nitride cap layer 15 using conventional lithographic and etching processes, e.g., resist and RIE process, well understood by those of ordinary skill in the art.

As shown in FIG. 18, an etch process, e.g., a wet etch process, is performed to remove the SOG block 75 beneath the aluminum pad 25. This process forms a gap 50. In accordance with aspects of the invention, the wet etch has access to the SOG block 75 by utilizing an aluminum pad mask (described further below) that is smaller than the opening 37 (FIG. 14) on, for example, two sides (in a similar manner to formation of the capture pad resist mask 45 as shown in FIG. 3). Additionally, a photosensitive polyimide (PSPI) layer 80 is deposited over the structure (e.g., spin applied), and etched using conventional lithographic and etching processes to form BLM:Al final via 83. The via 83 is aligned with the air gap 50.

As shown in FIG. 19, a BLM layer 40 is deposited over the PSPI layer 80 and within the BLM:Al final via 83. Additionally, a capture pad resist 85 is formed over a portion of the BLM layer 40.

As shown in FIG. 20, a BLM wet etch process is performed to etch portions of the BLM pad 40. The capture pad resist 85 is also stripped to create discrete C4NP BLM pad 40. Additionally, as shown in FIG. 20, a C4 Pb-free solder bump 55 is placed, e.g., deposited, on the BLM structure 40 using, e.g., a C4NP transfer process, well understood by those of ordinary skill in the art. The BLM structure 30 is over the air gap 50.

Figure 22:
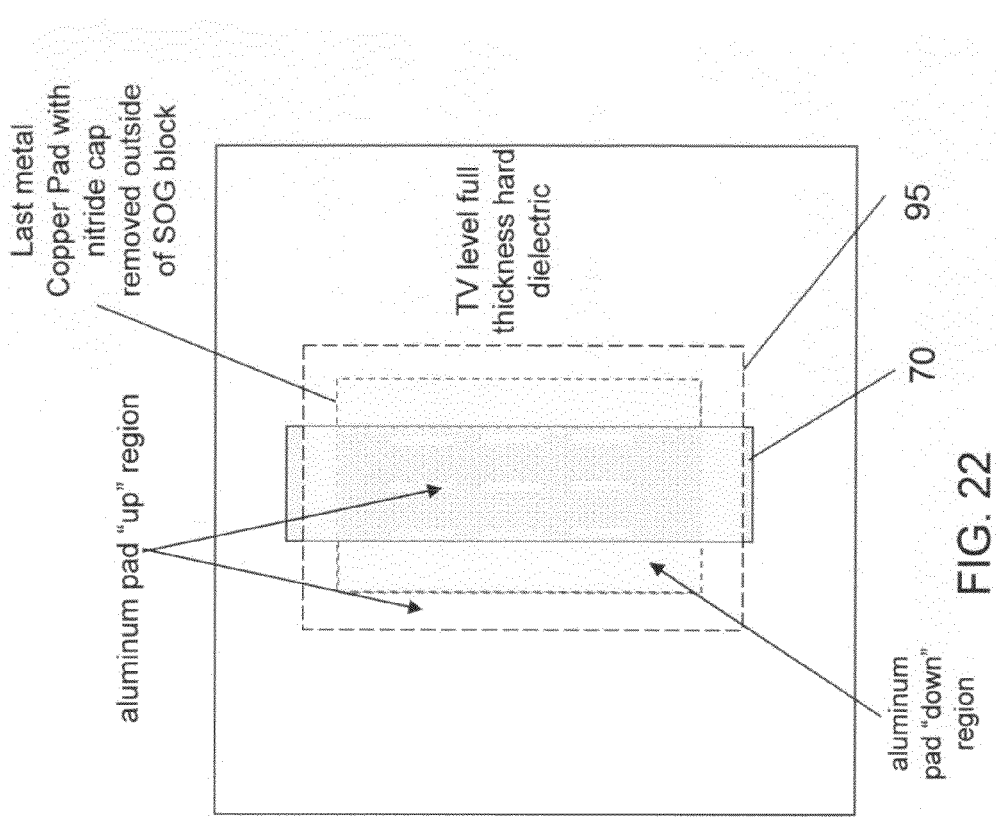
FIGS. 21-24 show top views of exemplary masks used to form a C4 structure having an air gap in accordance with aspects of the invention.
Figure 21:
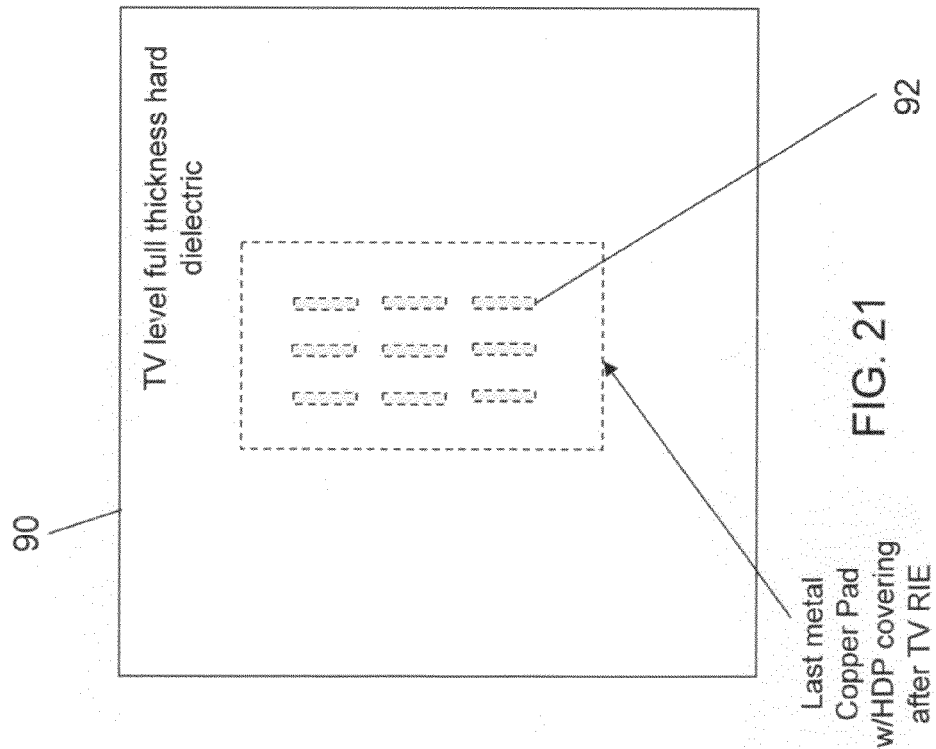
Figure 24:
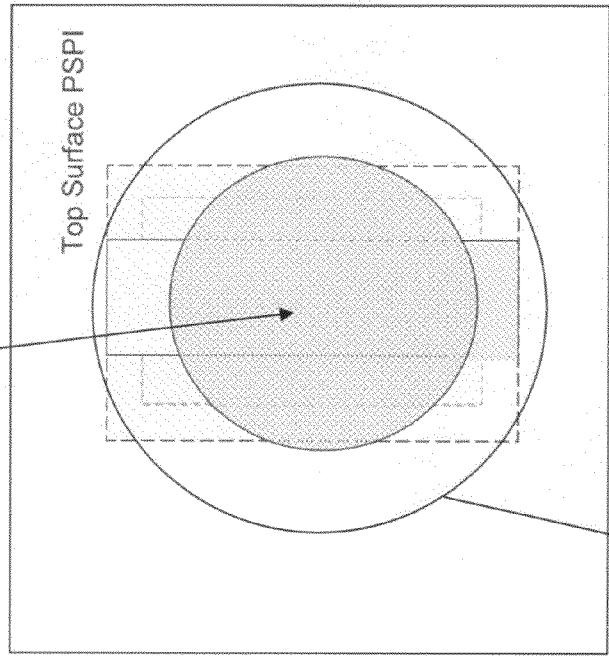
Figure 23:
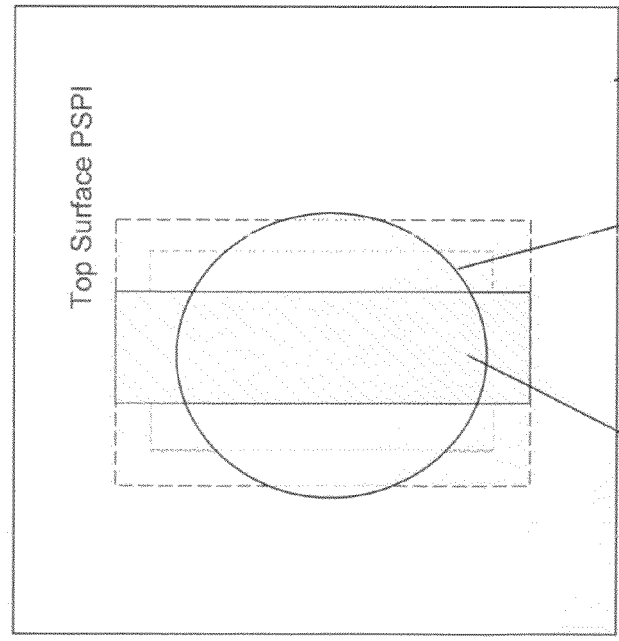

FIGS. 21-23 illustrate a series of exemplary masks that may be used to form the exemplary C4 structure shown in FIG. 24 (which is also illustrated in a side view in FIG. 20) in accordance with aspects of the invention. FIG. 21 illustrates a mask 90, which is used to etch the opening 37 through the nitride layer 17 and the bulk oxide layer 18 to the cap nitride layer 19 (e.g., using an RIE). Additionally, FIG. 21, illustrates oxide cheesing shapes 92 as should be understood by those of ordinary skill in the art.

FIG. 22 shows an exemplary mask 70 for patterning the SOG block 75 (as illustrated in FIGS. 15 and 16) in accordance with aspects of the invention. The mask 70 can be used to etch portions of the nitride cap layer 19 over the copper pad 10, as shown in FIG. 16. FIG. 22 also shows an exemplary mask 95 for forming the aluminum pad 25, as illustrated in FIG. 17. The mask 95 may be designed smaller at, for example, two ends than the mask 70 for patterning the SOG block 75, so as to allow for "clean-out" of the SOG material after the aluminum pad process level is complete.

Thus, using the masks as shown in FIG. 22, a resulting structure (shown in FIG. 20) includes a portion of the aluminum pad formed above the SOG block (and a portion of the nitride cap layer 19) and above the bulk nitride layer 17, which is designated as an aluminum pad up region. This portion is designated as the aluminum pad up region, as the resulting structure (shown in FIG. 20) includes an aluminum pad 25 that is up on the SOG block 75 and the bulk nitride 17. Additionally, the resulting structure (shown in FIG. 20) includes a portion of the aluminum pad 25, designated as an aluminum pad "down" region, which is in contact with the copper pad 10. This region is designated as an aluminum pad "down" region as the aluminum pad 25 is down on the copper pad level 10 (shown in FIG. 20).

FIG. 23 illustrates an exemplary mask 97 used to etch the PSPI layer 80 to form the BLM:Al final via 83, as shown in FIG. 18. Additionally, FIG. 23 illustrates an exemplary BLM capture pad resist mask 85, which is used to etch portions of the BLM layer 40, as shown in FIGS. 19 and 20.

FIG. 24 illustrates an exemplary top view of the structure after a C4 solder ball 55 has been placed, e.g., by a C4NP process. As shown in FIG. 24, the final via contact area is between the aluminum up region and the BLM capture pad, which is also illustrated in the side views of FIGS. 19 and 20.

Sidewall Supporting Shoulder Structure

In accordance with further aspects of the invention, a supporting material formed around the C4 edge allows a favorable distribution of stresses that will prevent white bumps. In embodiments, a structure, e.g., a supporting shoulder or a collar structure, is created at the wafer level to which the C4 solder balls self-align during reflow. In this way, the C4 solder ball automatically leans onto the sidewall support (e.g., collar structure or supporting shoulder). In embodiments, the sidewall support is created as part of the C4 support structure directly by serving as the base for BLM coverage beneath the outer perimeter of the C4 itself. In embodiments, the present invention may employ a half-tone mask or a thin-second-PSPI film apply process to form a final collar that is continuous in the surface plane, but not of uniform height.

Figures 25, 26:
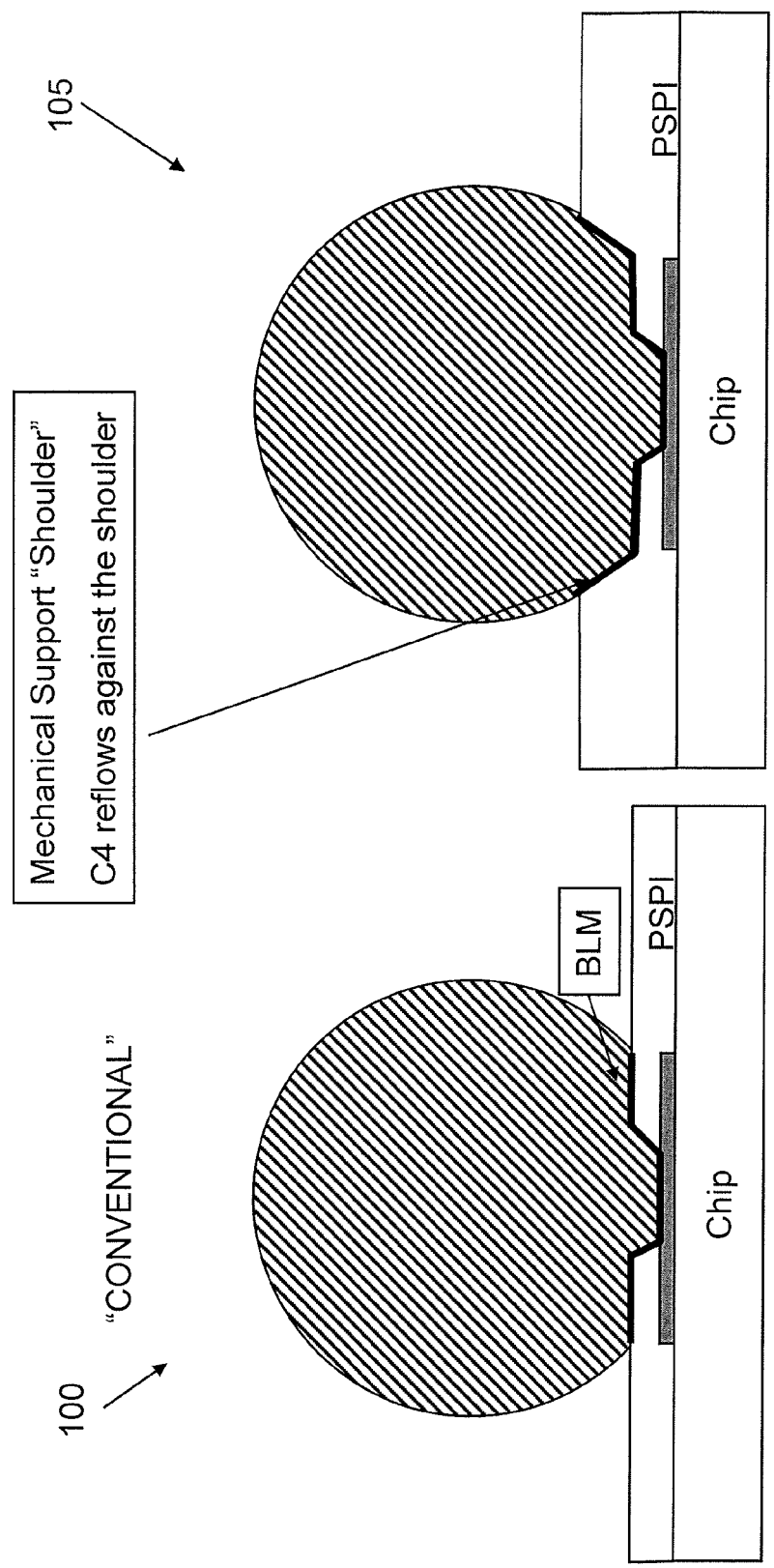
FIG. 25 illustrates a process of record (POR) C4 structure.
FIG. 26 shows an exemplary C4 structure having a support shoulder in accordance with additional aspects of the invention.

FIG. 25 illustrates a conventional C4 structure 100, which does not include a supporting shoulder structure. In contrast, FIG. 26 illustrates a C4 structure 105 with an exemplary supporting shoulder structure, or collar structure. In embodiments, the supporting shoulder comprises a supporting material (e.g., PSPI) around the C4 edge. The supporting material allows for a favorable distribution of stresses that will prevent white bumps, in accordance with aspects of the invention.

FIGS. 27-30 illustrate exemplary intermediate processing steps in the formation of a C4 structure shown in FIG. 31, which utilizes a C4NP transfer process. As shown in FIG. 27, a chip 110 includes a copper pad layer 10 and a PSPI layer 20. As shown in FIG. 28, the PSPI layer 20 is etched to the copper pad layer 10 using conventional lithographic and etching processes (e.g., a tapered exposure or greytone) to form a supporting shoulder 115 in addition to a BLM:Al pad via 37.

As shown in FIG. 29, a BLM layer 40 is deposited over the PSPI layer 20 and the copper pad layer 10, within the opening. Conventional lithographic and etching processes are used to remove portions of the BLM layer 40 beyond the supporting shoulder 115 and the BLM:Al pad via 37, as shown in FIG. 29.

FIG. 30 shows a placement of the C4 solder ball 55 within the supporting shoulder 115 and the BLM:Al pad via 37 using a C4NP transfer process to form the final C4 structure shown in FIG. 31. The C4 solder ball 55 is supported by the supporting shoulder 115 to provide a greater extent of support than the support provided with a conventional C4 structure shown in FIG. 25.

FIGS. 32 and 33 show intermediate processing steps and related structures and FIG. 34 shows a C4 structure and processing steps in accordance with a embodiment of the invention. This embodiment uses a "plated" process to form the C4 structure. FIG. 32 follows the processing of FIG. 29 (described above) without the lithographic and etching processes of the BLM layer 40. That is, as shown in FIG. 32, the BLM layer 40 has not yet been etched in those regions beyond the supporting shoulder 115 and the BLM:Al pad via 37. Additionally, as shown in FIG. 32, a riston 120 and plate 125 (comprising the solder ball material) are formed over the BLM layer 40, using conventional lithographic, etching and deposition processes well understood by those having ordinary skill in the art.

As shown in FIG. 33, the riston 120 and portions of the BLM layer 40 beyond the supporting shoulder 115 and the BLM:Al pad via 37 are stripped using conventional processes well understood by those having ordinary skill in the art. As shown in FIG. 34, the plate 125 is reflowed to form the C4 solder ball 55 using processes well understood by those having ordinary skill in the art. Additionally, as shown in FIG. 34, the C4 solder ball 55 is supported by the supporting shoulder 115 to provide a greater extent of support than the support provided with a conventional C4 structure shown in FIG. 25.

FIGS. 35-40 show exemplary C4 structures having varying shoulder support structures, in accordance with aspects of the invention. FIG. 35 shows the C4 structure shown in FIG. 34 above for comparison purposes. FIG. 36 illustrates a C4 structure having a contoured PSPI layer 130. As should be understood, the contoured PSPI layer 130 may be formed using conventional lithographic and etching processes (e.g., greytone processes) well known to those having ordinary skill in the art. With greytone processes, the contoured PSPI layer may be formed using a one-step lithography process, instead of two or more lithography processes. That is, a "grey-tone" mask is one that provides a partial optical exposure in the transition region between full exposure (transparent area on mask) and no-exposure (opaque on mask) zones. The contoured PSPI layer 130 allows for an underfill flow around the C4 solder ball 55.

FIG. 37 shows an exemplary C4 structure having an additional layer 135 formed above the PSPI layer 20. The additional layer 135 may be PSPI or another suitable material (e.g., SOG, a dielectric, etc.). The additional layer 135 may be formed using conventional lithographic and etching processes well understood by those having ordinary skill in the art. In comparison to the embodiment of FIG. 35, wherein the single PSPI layer 20 is formed using a tapered etching process (e.g. with a "grey-tone" specialized photo mask) to have the BLM:Al pad via 37 and the supporting shoulder 115, the embodiment of FIG. 37 requires an additional masking step and etching step. A "grey-tone" mask is one that provides a partial optical exposure in the transition region between full exposure (transparent area on mask) and no-exposure (opaque on mask) zones. More specifically, as shown in the example of FIG. 37, the BLM:Al pad via 37 is formed in the PSPI layer 20 using conventional masking and etching processes. Additionally, the supporting shoulder 115 is formed in the additional layer 135 using conventional masking and etching processes. However, utilizing two layers (i.e., the PSPI layer 20 and the additional layer 135) may avoid any difficulties encountered in optimizing the greytone mask used, for example, with the embodiment of FIG. 35. FIGS. 38-40 correspond to the embodiments of FIGS. 35-37, however the embodiments of FIGS. 38-40 each have utilized a BLM mask, such that the BLM layer 40 is not formed on the supporting shoulder 115.

FIGS. 41-43 show exemplary stress plots (each with the same stress scale) for C4 structures. More specifically, FIG.

41 shows a stress plot for a POR structure (e.g., as shown in FIG. 25). FIG. 42 shows a stress plot for a structure having a contoured PSPI layer 130 (e.g., as shown in FIG. 36) in accordance with aspects of the invention. FIG. 43 shows a stress plot for a structure having an extended PSPI layer 20 (e.g., as shown in FIG. 35) in accordance with additional aspects of the invention. There are two high-stress zones of concern, one extending down directly beneath the final polyimide via edge, and the second extending down from the outer BLM edge up on top of the polyimide. Moreover, with POR structures (e.g., as shown in FIG. 41), these two stress zones can be convergent and reinforce each other. However, in accordance with aspects of the invention, the supporting shoulder 115 has the effect of translating the high stress region away from the final via edge, and providing cushioning at the critical edge of the BLM/C4 structure for the tensile stresses incurred during chip-join and thermal cycling.

As can be observed in FIG. 41, the stresses of the POR structure are located under the BLM layer 40 and aluminum pad layer 25 and create an initiation point for delamination, as indicated. Moreover, as shown in FIG. 41, the two stress zones are on top of each other, e.g., convergent, which creates a higher risk for BEOL damage down in the wiring levels.

In contrast, as shown in each of FIGS. 42 and 43, which illustrate stress plots for structures in accordance with aspects of the invention, the stresses have been moved essentially beyond the aluminum pad layer 25 and do not present the initiation point for delamination, which occurs in the POR structure of FIG. 41. Moreover, as shown in FIGS. 42 and 43, the high stress zones are separated from one another, such that they do not converge with one another, which creates lower risk for BEOL damage down in the wiring levels. Additionally, the stress region shown in FIG. 43 is less extensive as compared to the stress region of FIG. 41. Moreover, the overall stress levels are lower in both the contoured PSPI layer embodiment (FIG. 42) and the extended PSPI layer embodiment (FIG. 43) as compared to the POR structure (FIG. 41).

TABLE 1 shows exemplary maximum relative stress levels at the critical delamination location results for C4 structures, including the POR structure (e.g., as shown in FIG. 25), a contoured PSPI layer 130 (or wedge) around the C4 (e.g., as shown in FIG. 36), an extended PSPI layer 20 (e.g., as shown in FIG. 35) and an extended higher modulus material layer.

| Modeling Case | Max. relative stress at critical delamination location (POR = 1) |
| --- | --- |
| POR, no PSPI reinforcement | 1 |
| PSPI "wedge" around C4 | 0.79 |
| Extended PSPI (E = 3 GPa) layer to cover the vicinity of the C4 | 0.75 |
| Extended layer of higher modulus material (E = 9 GPa) | 0.70 |

Oval Solder Balls

In accordance with aspects of the invention, by changing the shape of the C4s such that the C4s are no longer round at the bottom and top, the stresses on the C4s can be dramatically reduced. This offers a reduction of risk of C4 fatigue, as well as a risk reduction of C4 white bumps.

More specifically, in accordance with further aspects of the invention, a BLM pad dimension of the peripheral C4s (e.g., corner C4s and/or edge C4s) in the direction of the distance to neutral point (DNP) axis is reduced compared to the normal C4s in the chip-center area. With such a reduced BLM pad dimension, when C4 solder is deposited on the BLM pad, the C4 assumes an oval shape. That is, for example, whereas the chip-interior C4s on a chip may have a spherical shape, in accordance with additional aspects of the invention, the chip-peripheral C4s may have a three-dimensional oval shape. In embodiments, the outer three rows of C4s may have the oval shape, with other arrangements contemplated by the invention. For example, in embodiments, the three outer rows of C4s in the corners of the chip may have the oval shape. Additionally, in embodiments, more or less than the outer three rows in the corners of C4s may have an oval shape in accordance with aspects of the invention. Moreover, in embodiments, the three outer rows of C4s along the edges of the chip may have the oval shape. Additionally, in embodiments, at least a majority of the C4s have an oval shape and/or all of the C4s may have an oval shape.

Utilizing C4s having an oval shape in the periphery of the chip (e.g., the outer three rows of the corners or edges) reduces stress on the C4s, which leads to longer thermal cycling life of the interconnect. That is, the oval-shaped C4s render the C4s more flexible. Also, the oval-shaped C4s reduce stress on the BEOL dielectric, in embodiments reducing a peak stress by approximately sixty-one percent, which leads to reduced C4 white bump risk.

In embodiments, the oval C4 shape may be realized, for example, by changing the BLM shape. That is, instead of the BLM shape having a circular shape (which results in a spherical C4, aspects of the invention use an oval shaped BLM (which results in an oval C4). C4NP bumping technology is well-suited to take advantage of this aspect of the invention. Moreover, there is no impact of cost/cycle time of changing the BLM shape.

FIG. 44 shows a chip having a plurality of C4s, with the left-hand side illustrating conventional peripheral C4s 205 having a spherical shape and the right-hand side illustrating an exemplary configuration of oval C4s 210 in the corners of the chip in accordance with aspects of the invention. FIG. 45 shows a top down view of a spherical (or elongated) C4 210 showing axis of sheer stress 215.

Figure 46:
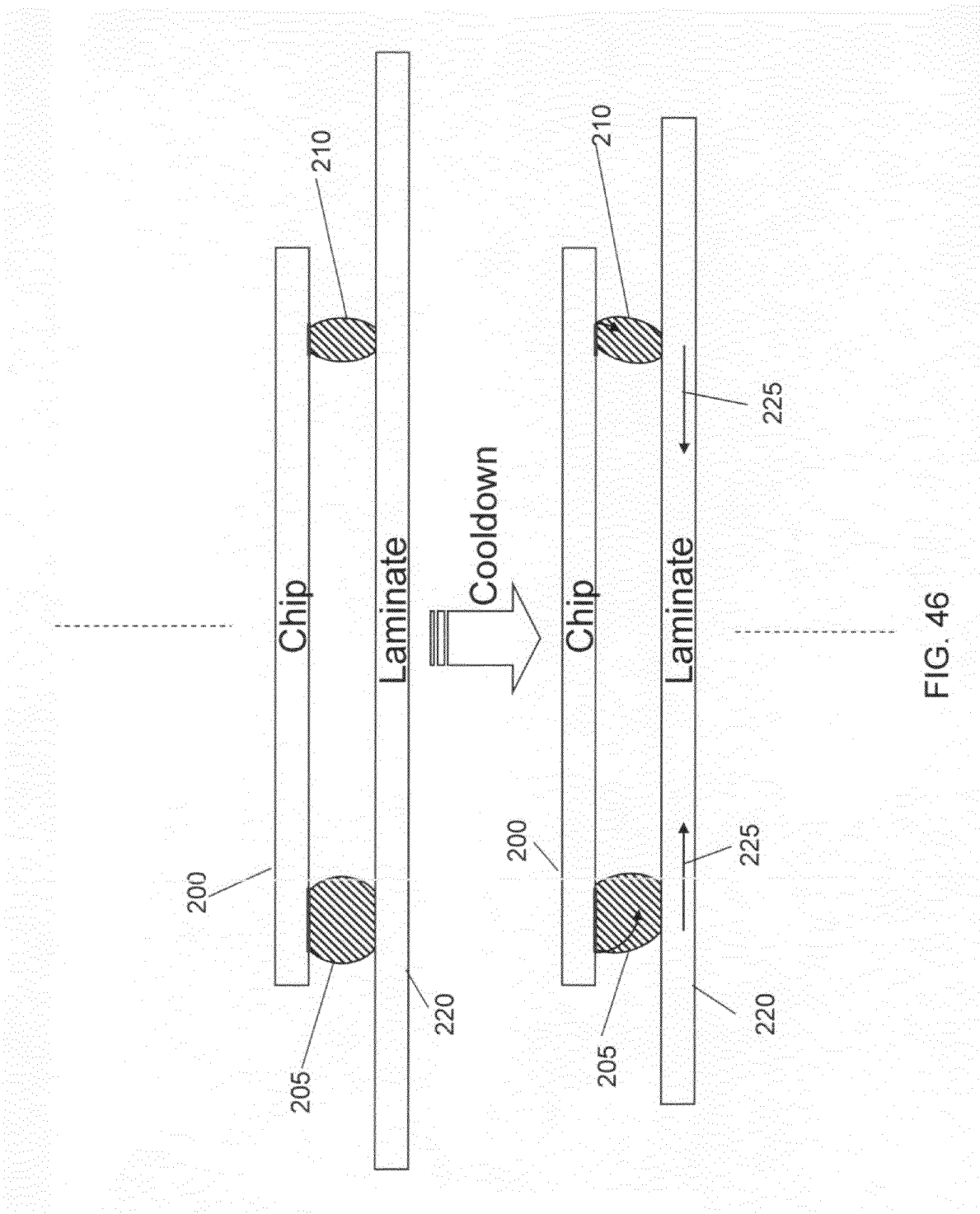
FIG. 46 shows a chip containing POR C4 structures and exemplary elongated C4 structures attached to a laminate and illustrates the stresses incurred on the C4 structures upon cooldown.

FIG. 46 shows exemplary side views of a chip 200 attached to a laminate 220 using spherical C4s (on the left-hand side) and oval C4s (on the right-hand side) before and after cooldown. As can be seen in FIG. 46, upon cooldown, due to differing CTEs, sheer stress (represented by arrow 225) is caused in the chip 200 and the C4s, which attach the chip 200 to the laminate 220. However, by utilizing the oval C4s 210 in the periphery of the chip in accordance with aspects of the invention, a C4 peak stress may be reduced by approximately sixty-one percent. Additionally, as shown in FIG. 46, in accordance with aspects of the invention, the same method of forming oval BLMs (such that an oval C4 results) can also be used on the laminate 220 by changing the solder resist opening of the laminate 220 to an oval shape.

Keep Out Zones

According to further aspects of the invention, a BEOL design methodology may be utilized to minimize the impact of tensile stress fields, which extend down into the BEOL and result in white bump formation. Two primary tensile stress points (which are independent of the underlying copper wire structures) have been identified by modeling: one tensile stress point at the edge of the BLM and another tensile stress point at the base of the polyimide final via (located on the side of the C4 situated away from the chip centerpoint). Additionally, another failure mode involves CTE-driven underfill delamination (or CPI chip-level cracking) that originates, for example, at the chip edge or corner and continues to grow during, e.g., reliability stressing or thermal cycling of the chip in the field. The delamination may continue to grow along the underfill/chip passivation interface until it reaches nearby C4 locations where the crack can propagate either through the C4 bump or down into the BLM or the chip BEOL wiring.

Figure 47:
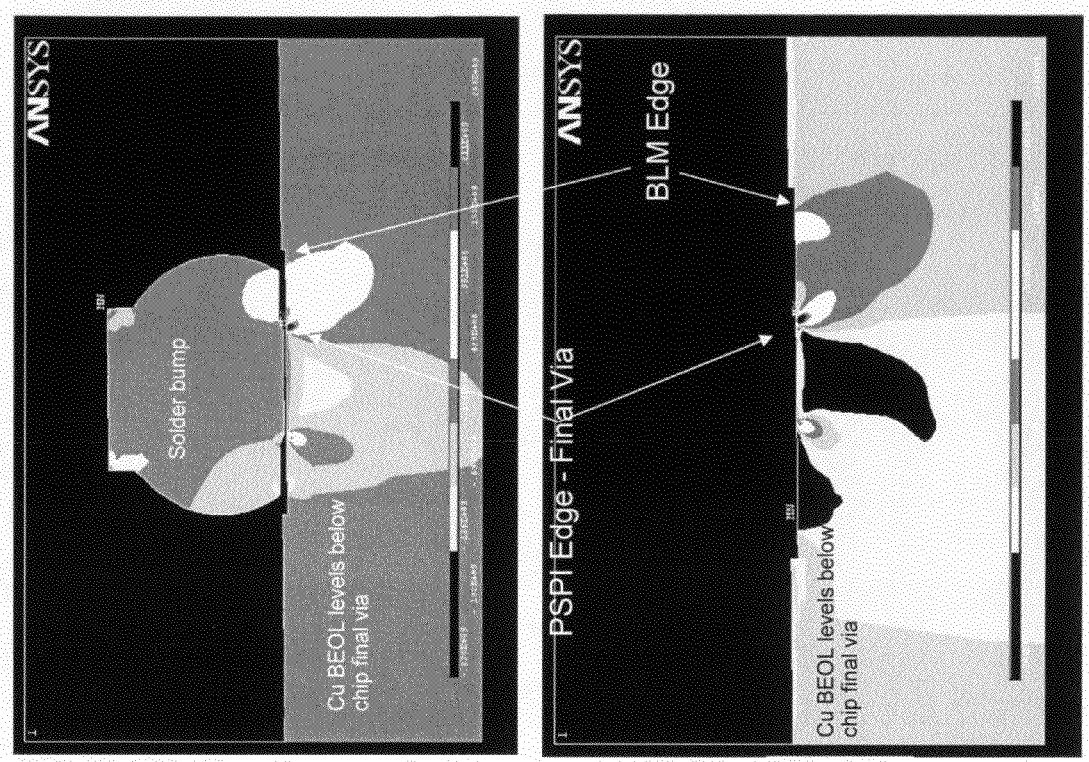
FIG. 47 shows stress plots for C4 structures illustrating the stresses incurred at the final via edge and the BLM edge.

FIG. 47 illustrates exemplary finite element modelings of a C4 structure. As shown in FIG. 47, the finite element modelings have identified two primary tensile stress regions that project downward from the final BLM structure into the BEOL. The first tensile stress region resides at the termination point of the BLM itself (i.e., the BLM edge, as labeled in FIG. 47), at the periphery of the C4. The second tensile stress region originates at the point where the base of the final polyimide via edge makes contact with the underlying level (i.e., the PSPI edge-final via, as labeled in FIG. 47). As shown in FIG. 47, stress is tensile on the outer edge of the C4 and extends down into the BEOL with stress peaks occurring at the edge of C4 final via (or PSPI edge) and at the edge of the BLM (on the chip-edge side).

Figure 48:
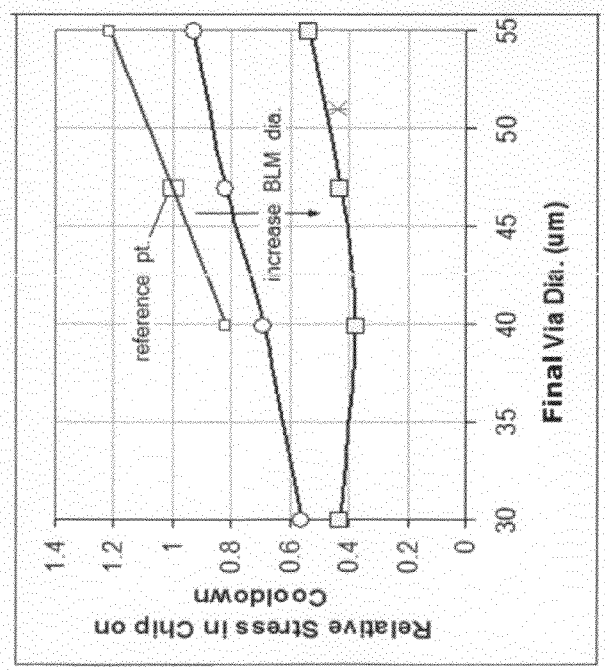
FIG. 48 shows a plot of relative stress in a chip on cooldown versus final via diameter for differing BLM diameters.

FIG. 48 shows an exemplary plot of relative stress in a chip upon cooldown versus final via diameter for C4s with differing BLM diameters. As can be observed from FIG. 48, as the BLM diameter is increased and/or generally as the final via diameter is decreased, such that the BLM edge is further from the final via edge, relative stress is reduced. Increasing the BLM diameter reduces the stress field by reducing impact from proximity of the final via. Conversely, as the BLM diameter is decreased and/or generally as the final via diameter is increased, such that the BLM edge is closer to the final via edge, relative stress is increased, as the final via edge and BLM stress fields begin to converge and reinforce each other.

These two stress regions at the BLM edge and the PSPI edge-final via are independent of the underlying wiring design. However, any wiring located in these stress regions is more apt to break in response to stresses experienced in at the BLM edge and the PSPI edge-final via.

In accordance with aspects of the invention, a design of the last few levels of BEOL copper wiring may be utilized with consideration of the final via and C4/BLM structure and placement; specifically with respect to the two above-described regions (or lobes) of tensile stress (located on the side of the C4 situated away from the chip centerpoint, i.e., the chip-edge side). For example, in embodiments, wiring is specifically excluded from these regions of high-tensile stress, using a keep-out zone in the design.

Additionally, in embodiments, the wiring layout beneath particular C4 bump locations may be optimized further by adding a design requirement that forces the final via size (FV or LV) to be determined by control of the separation distance between the BLM edge and the FV edge, so as to allow as much wiring spacing as might be needed without infringing upon the two stress regions. For example, high density wiring beneath a particular C4 location may drive the FV-to-BLM chord (i.e., the distance between the BLM edge and the final via (FV) edge) larger, in accordance with aspects of the invention. This enlargement in turn drives the FV image smaller (for example, as compared to a neighboring C4 location on the same chip). Thus, according to aspects of the invention, a customized final via level may be utilized with variable FV sizes across a particular chip design.

Figure 50:
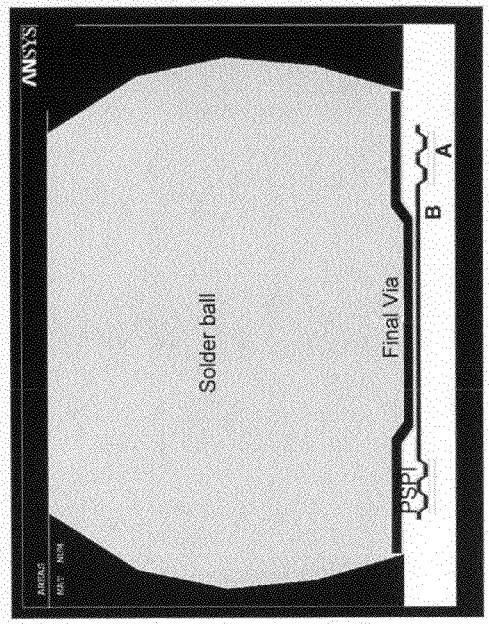
FIG. 50 shows an exemplary C4 structure illustrating a vertically offset connection.
Figure 51:
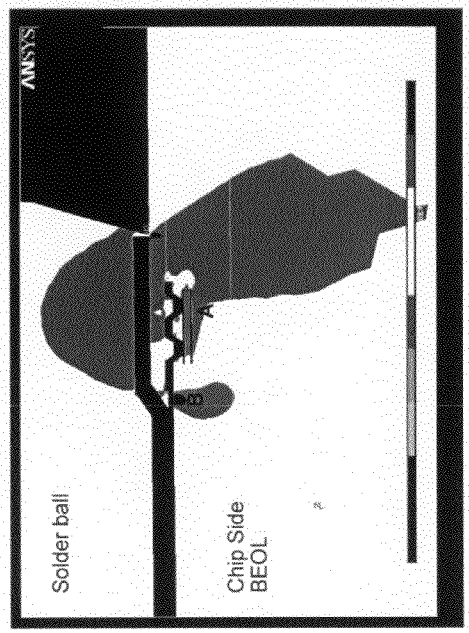
FIG. 51 shows a stress plot for the exemplary C4 structure of FIG. 50 having a vertically offset connection.
Figure 49:
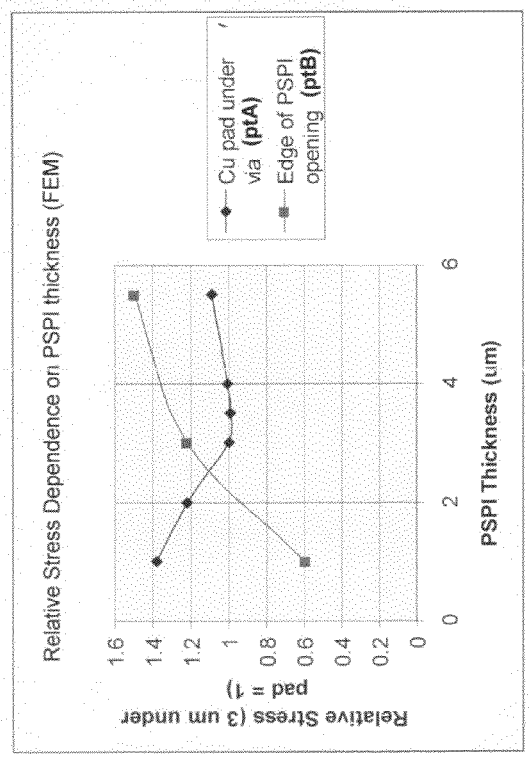
FIG. 49 shows a plot of relative stress in a chip versus PSPI layer thickness.

FIG. 49 illustrates a plot of PSPI thickness versus relative stress for the two above described regions, i.e. the final via edge region (identified as location "B") and the BLM edge (or copper pad under via region) (identified as location "A") as shown in FIGS. 50 and 51. Additionally, FIG. 49 illustrates a vertically offset connection between the final via edge region and the BLM edge. As indicated in FIG. 49, the chip level stresses depend in part on the PSPI layer thickness. More specifically, as shown the chip level stresses are inversely dependent upon PSPI layer thickness at the BLM edge (location A). Additionally, the chip level stresses are directly dependent upon PSPI layer thickness at the final via edge (location B).

FIG. 52 shows a C4 structure 300 having vias 315 formed in the above-described high stress regions, and FIGS. 53 and 54 show exemplary C4 structures 300' and 300" designed in accordance with aspects of the present invention. As shown in FIGS. 52-54, the stress regions 305 and 310 occur around the PSPI edge (or final via edge) and the BLM edge, respectively on the chip-edge side of the C4 structures. Moreover, as shown in FIG. 52, the C4 structure 300 includes vias 315 placed in the high tensile stress regions 305 and 310, which are subject to breakage and white bump formation.

As shown in FIG. 53, the C4 structure 300' includes vias which have been specifically placed at positions away from, e.g., outside of, the high stress regions 305 and 310. For example, a via 315 has been situated between the two high stress regions 305 and 310 and other vias 315 have been situated on the chip-center side of the C4 structure 300', which does not contain the high tensile stress regions 305 and 310 that are present on the chip-edge side. Additionally, as can be observed in comparing FIGS. 52 and 53, the final via diameter 320 is the same for both structures, such that the chord length 325 between the final via edge and the BLM edge is the same for each structure.

As shown in FIG. 54, the C4 structure 300" includes vias 315 positioned outside of the high stress regions 305 and 310. For example, two vias 315 are situated between the two high stress regions 305, 310. Also, other vias 315 are situated on the chip-center side of the C4 structure 300", which does not contain the high stress regions 305 and 310 observed on the chip-edge side.

Additionally, with the exemplary C4 structure 300" of FIG. 54, a local wiring design requirement (e.g., a requirement for additional wiring area) drives the final via edge farther away from BLM edge. This results in reduced final via size at this location. That is, as can be seen in comparing FIGS. 52 and 54, the final via diameter 320" of C4 structure 300" is smaller than the final via diameter 320 of the C4 structure 300, such that the chord length 325" between the final via edge and the BLM edge is larger. By reducing the final via diameter, and thus, effectively moving final via edge stress region 305, additional area is created in which to place wiring, e.g., vias 315.

In accordance with further aspects of the invention, a design methodology includes specifying copper BEOL wiring shapes and placement with respect to the final PSPI via layout and C4 bump dimension, such that underlying via connections and passing wiring are kept out of the known zones of high tensile stress. That is underlying via connections and passing wiring are kept out of regions approximately directly beneath BLM edge and approximately directly beneath the final via edge. The methodology may be applied to the tensile side of the chip (i.e., the chip-edge side or 180° of C4 distal to chip center). Wiring keep-out zones are defined for multiple wiring levels at a point directly beneath the final via base and for multiple wiring levels at a point directly beneath the BLM edge. In embodiments, a low-stress annular wiring region is defined between the keep-out zones. For example, in embodiments, keep-out zones of, e.g., approximately 5 µm-10 µm in length, may be used directly beneath BLM edge and FV edge for underlying wiring and via connections, with other keep-out zone lengths contemplated by the invention. In embodiments, the last-metal copper pads and proximal wiring may be designed in consideration of the final via and C4 design.

Additionally, the last metal copper pad and related wiring may be integrated with the final via and C4 shape and dimension wherever possible. As described above, in embodiments, each of the final via (FV) diameters on a given chip may not be the same, but may depend on specific wiring requirements at a particular location on the chip. Furthermore, the distance between the final via and the BLM edge may be maximized depending on specific local wiring requirements. For example, the final via opening may be minimized for given solder bump dimension to prevent the final via stress region from intersecting (and amplifying) the BLM stress region.

FIG. 55 shows side and top down views of a C4 structure 350 illustrating exemplary groundrule parameters defined by the above-described methodology in accordance with aspects of the present invention. As shown in FIG. 55, a C4 structure 350 has a final via diameter "a" and a BLM (or UBM) diameter "b." Additionally, point "A" is defined as the point in the final BEOL level at the base of the polyimide (or PSPI) via and point "B" is defined as the point in the final BEOL level directly beneath the BLM edge. The segment AB is the reference line segment connecting point A with point B, wherein AB=(b−a)/2.

FIG. 56 shows an additional view illustrating exemplary groundrule parameters defined by the above-described methodology in accordance with aspects of the present invention. As shown in FIG. 56, the centerpoint of AB defines the center of the annular wiring region 353. Additionally, the shaded areas indicate keep-out zones 355 and 360 within the dimension of the BLM and a keep-out zone 365 extending outside of the BLM layer. In embodiments, the radial distance of the keep-out zones 355, 360 and 365 may be approximately 5 µm-10 µm, with other distances contemplated by the invention.

As described above, in embodiments, the low-stress annular wiring region 353 may be enlarged (e.g., such that the wiring region may accommodate additional wiring) by custom minimization of final via size at each C4 location. Wiring is placed so as to be centered within this enlarged region, while respecting the keep-out zones. In embodiments, the final via size may be reduced to a minimum limit required for an electrical connection.

For example, in accordance with aspects of the invention chord length AB may be maximized by minimizing final via size (a) in accordance with exemplary inequality (1).

$$(\text{min via size required for current}) < \{a\} < b : \{(b-a)/2 \geq /=-10 \text{ um}\} \quad (1)$$

wherein (b−a)/2=AB; b=BLM diameter; and a=final via diameter. Inequality (1) directs that "a" (the final via size, which can be customized at each via location) has a low-limit that should be greater than the size necessary to effectively conduct the current required by the particular design, and is bounded at the high end by a size that would leave the AB segment to be at least 10 µm long (e.g., to provide sufficient space for the annular wiring region 353).

Additionally, as described above, the midpoint of AB may be used as the centerpoint of the annular wiring region 353 for multiple underlying wiring levels. That is, the centerpoint of the AB segment should be taken as the centerpoint of the underlying design area that is being created by the above-described methodology for chip level wiring that is intended to be kept out of the high stress lobe regions located under the edge of the final via and the BLM edge.

Metal Pad Extension

The stress at a particular C4 solder bump acts in a manner that is compressive on one side of the solder bump (towards the chip-center side) and tensile on the other side of the solder bump (towards the chip-edge side). The tensile forces acting on the chip-edge side may cause BEOL damage. As discussed above, tensile forces are most intense at two primary locations, i.e., approximately directly beneath the edge of the BLM solder pad and approximately at the very base of the polyimide final via through which the solder bump connects to the BEOL metallization at an aluminum or copper pad. To overcome high stresses, a top-metal aluminum metal pad extension out beyond the overlying peripheral dimension of the BLM layer may be utilized to mitigate white bump tensile stress translation to chip BEOL levels through the solder bump.

More specifically, in accordance with aspects of the invention, a pad extension, e.g., aluminum pad, (versus normal POR dimensions) may be used to reduce the transfer of stress on the C4 solder ball to the underlying BEOL levels. In embodiments, the metal pad extension may be a symmetrical x, y metal pad extension. Additionally, in accordance with further aspects of the invention, the pad may be extended on the one side of the solder bump structure that would experience tensile forces which cause "white bumps," i.e., the outer edge of the pad oriented away from the chip-center side.

In embodiments, the symmetrical extension of the size of the metal pad in all x and y dimensions may be utilized, such that the metal pad extends laterally well beyond the overlying BLM/UBM edge (as viewed from above). In accordance with aspects of the invention, the extended metal pad "wings" insert a stress buffer that protects against breakage of the underlying BEOL level at this location. Furthermore, the extended metal pad contributes additional resistance to bending with the additional metal pad mass.

Figure 57:
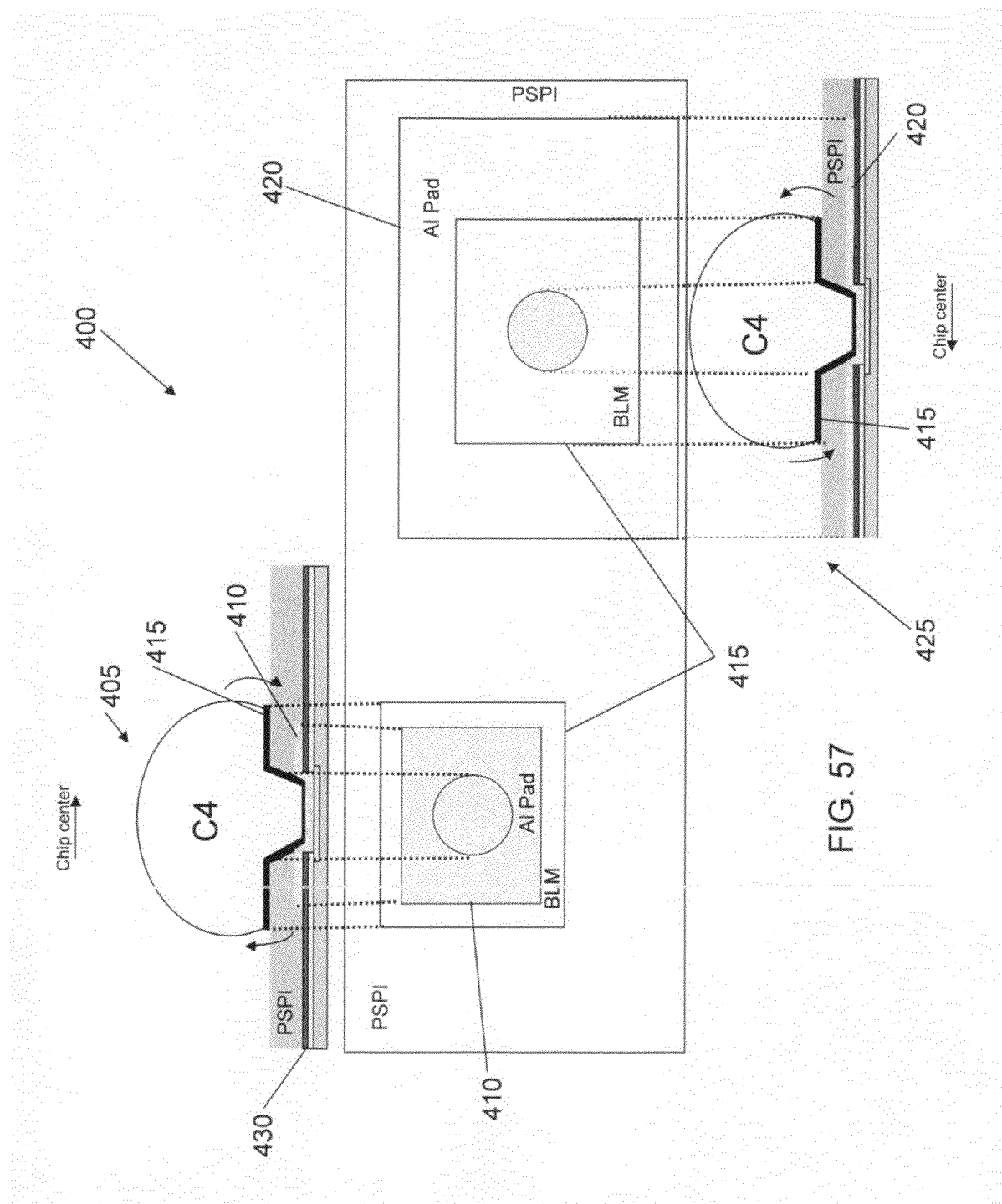
FIGS. 57 and 58 illustrate chips having a POR metal pad and extended metal pads in accordance with aspects of the invention.

FIG. 57 shows an exemplary chip 400 containing a C4 structure 405 formed using a POR process (on the left-hand side) along side a C4 structure 425 formed in accordance with aspects of the present invention. The exemplary chip 400 illustrates the different metal pad (e.g., aluminum or copper pad) sizes. As shown on the left-hand side, the C4 structure 405 formed using a POR process includes a metal pad 410 (e.g., an aluminum pad) whose dimensions are smaller than the BLM layer 415. Thus, the aluminum pad 410 is fully contained within the boundaries of the overlying BLM layer 415 (as viewed from above), leaving the underlying BEOL exposed directly to tensile stresses, which pulls on the hard dielectric 430. As such, upon the POR C4 structure 405 experiencing tensile stress (on the chip-edge side), the tensile and rotational stresses on the C4 solder ball are transferred to the underlying BEOL level, causing undesirable breakage thereof.

In contrast, as shown on the right-hand side of FIG. 57, an exemplary C4 structure 425 has a metal pad 420 (e.g., an aluminum pad) which is symmetrical extended such that the aluminum pad 420 expands beyond the boundaries of the overlying BLM layer 415 (as viewed from above). As a result, tensile force pulls on the aluminum pad layer 420 (e.g., having a 2 µm thickness) over a hard dielectric layer 430, mitigating white bump stress transfer to the BEOL level.

Figure 58:
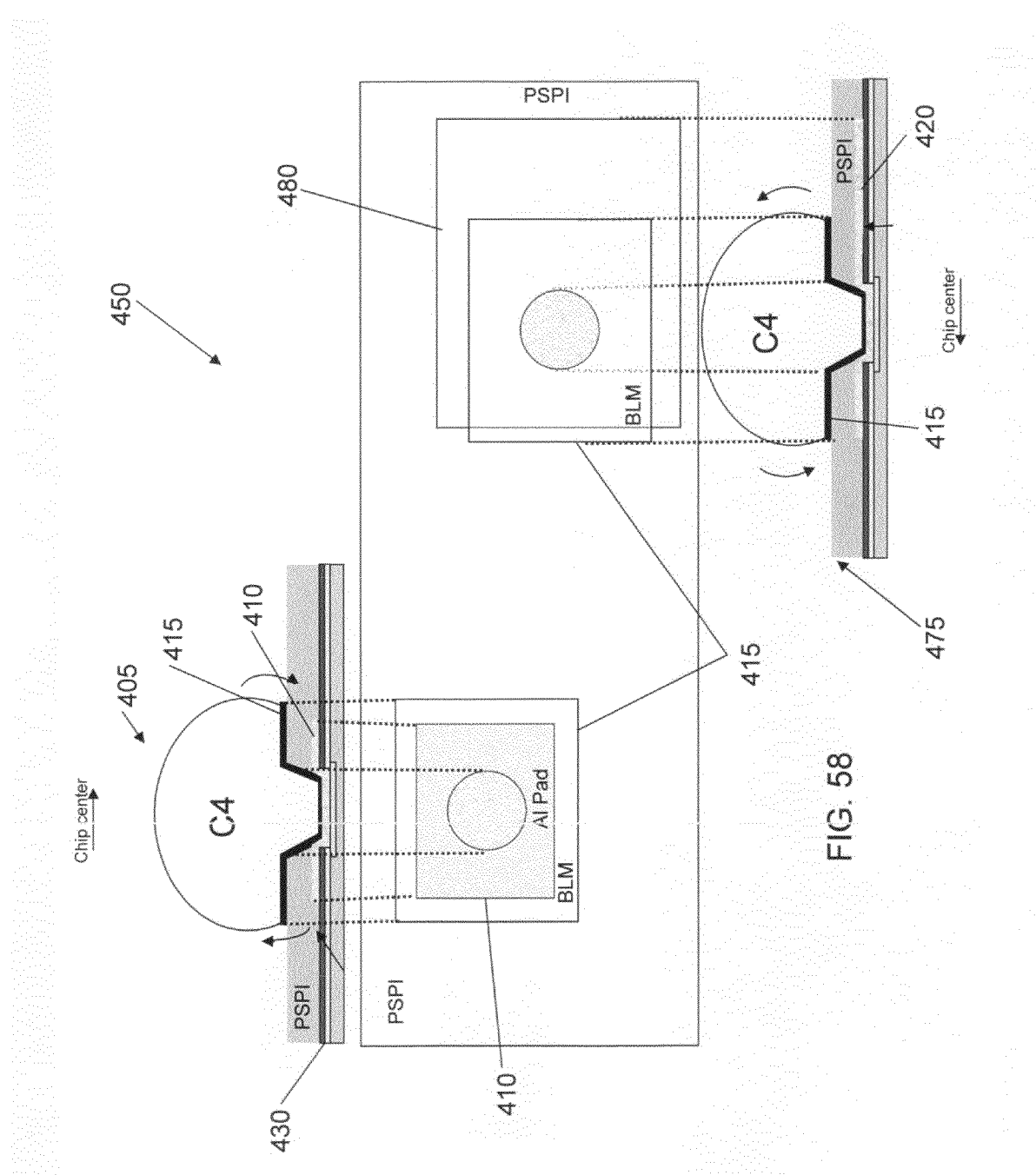

FIG. 58 shows an exemplary chip 450 containing a C4 structure 405 formed using a POR process (on the left-hand side) along side a C4 structure 475 formed in accordance with aspects of the present invention (on the right-hand side). The exemplary chip 450 illustrates the different metal pad (e.g., aluminum or copper pad) sizes. The C4 structure 405 formed using a POR process, shown on the left-hand side of FIG. 58 is described above with reference to FIG. 57.

As shown on the right-hand side of FIG. 58, in the exemplary C4 structure 475 the metal pad 480 (e.g., an aluminum pad) has been non-symmetrically extended beyond the BLM layer 415 on side away from chip center where tensile forces act, such that the aluminum pad 480 expands beyond the boundaries of the overlying BLM layer 415 on the chip-edge side of the C4 structure 475 (as viewed from above). Additionally, as shown in FIG. 58, the metal pad 480 is extended on two additional sides, such that the metal pad 480 is larger than the BLM layer 415 on those two additional sides. Furthermore, the metal pad 480 has been extended on an additional side towards the chip center; however, in the example of FIG. 58, the metal pad 480 is smaller than the BLM layer 415 on that side.

As a result of the metal pad extension, tensile force pulls on the aluminum pad layer 480 (e.g., having a 2 μm thickness) over a hard dielectric layer 430, mitigating white bump stress transfer to the BEOL level. As should be understood, while FIG. 58 depicts a metal pad extension in all four directions, the invention contemplates that extension of the metal pad 480 could be in one, two, three or four directions, as long as the metal pad is at least extended in a chip edge direction beyond the BLM layer 415. Additionally, in embodiments, the metal pad 480 could be extended in one, two, three or four directions, as long as the metal pad is at least extended in a chip edge direction at least to a same extent as the BLM layer 415.

Figure 60:
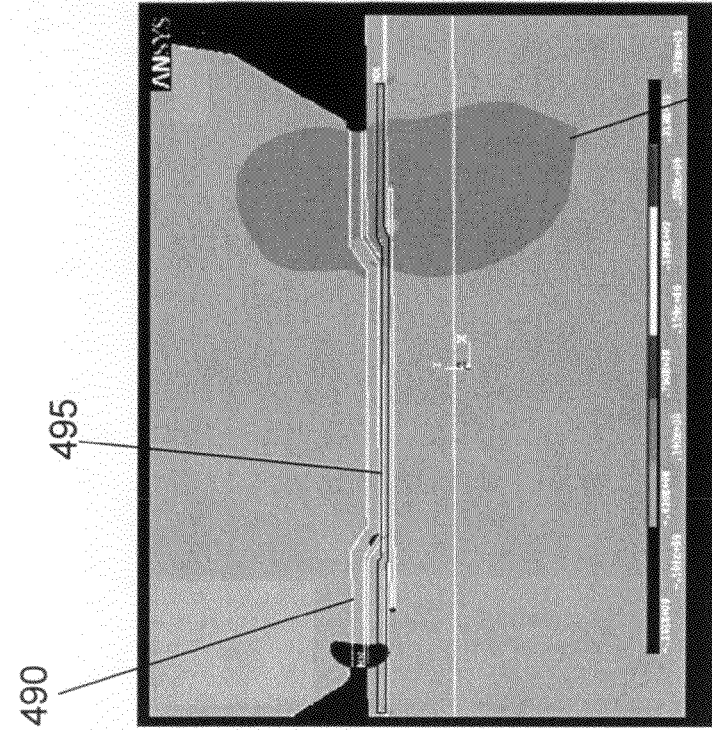
FIG. 60 shows a stress plot for a C4 structure having an extended metal pad in accordance with aspects of the invention.
Figure 59:
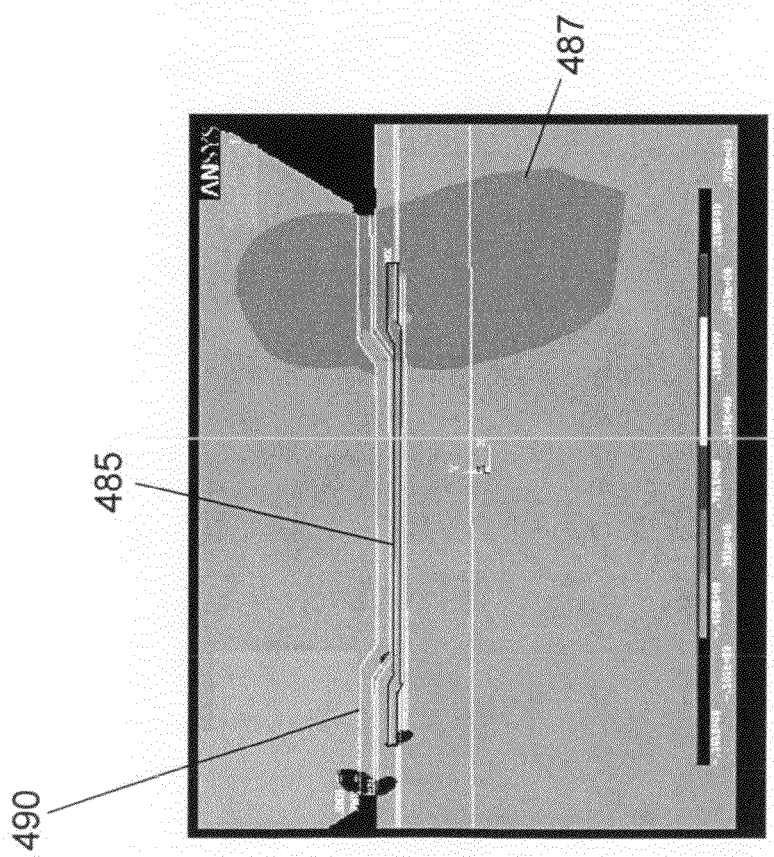
FIG. 59 shows a stress plot for a C4 structure having a POR metal pad.

FIGS. 59 and 60 show stress plots for two C4 structures. More specifically, FIG. 59 shows a stress plot for a POR C4 structure having a metal pad 485 that is fully contained within the boundaries of the overlying BLM layer 490 (as viewed from above). In contrast, FIG. 60 shows a stress plot for a C4 structure designed in accordance with aspects of the invention. That is, FIG. 60 shows a stress plot for a C4 structure having an extended metal pad 495 beyond the boundaries of the overlying BLM layer 490 (as viewed from above). As shown in FIGS. 59 and 60, the approximate locations of the respective metal pads 485 and 495 (e.g., aluminum pads) are outlined in black.

As shown in FIGS. 59 and 60, stress is monitored at local maximum in the oxide under the BLM edge on the chip-edge side of the C4 structure. However, in comparing FIGS. 59 and 60, with the C4 structure having the extended metal pad 495 (shown in FIG. 60), a smaller stress region lobe 497 is measured than the stress region lobe 487 measured for the C4 structure having the POR metal pad 485 (shown in FIG. 59). Moreover, while it may be difficult to discern in the gray-shaded images of FIGS. 59 and 60, the C4 structure having the extended metal pad 495 experiences a lower level of stress throughout the stress region lobe 497, as compared to the C4 structure having the POR metal pad 485. In embodiments, the tensile stress experienced in the C4 structure having the extended metal (e.g., aluminum) pad is reduced by 20% as compared to the POR C4 structure having a POR metal pad.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

Design Flow

Figure 61:
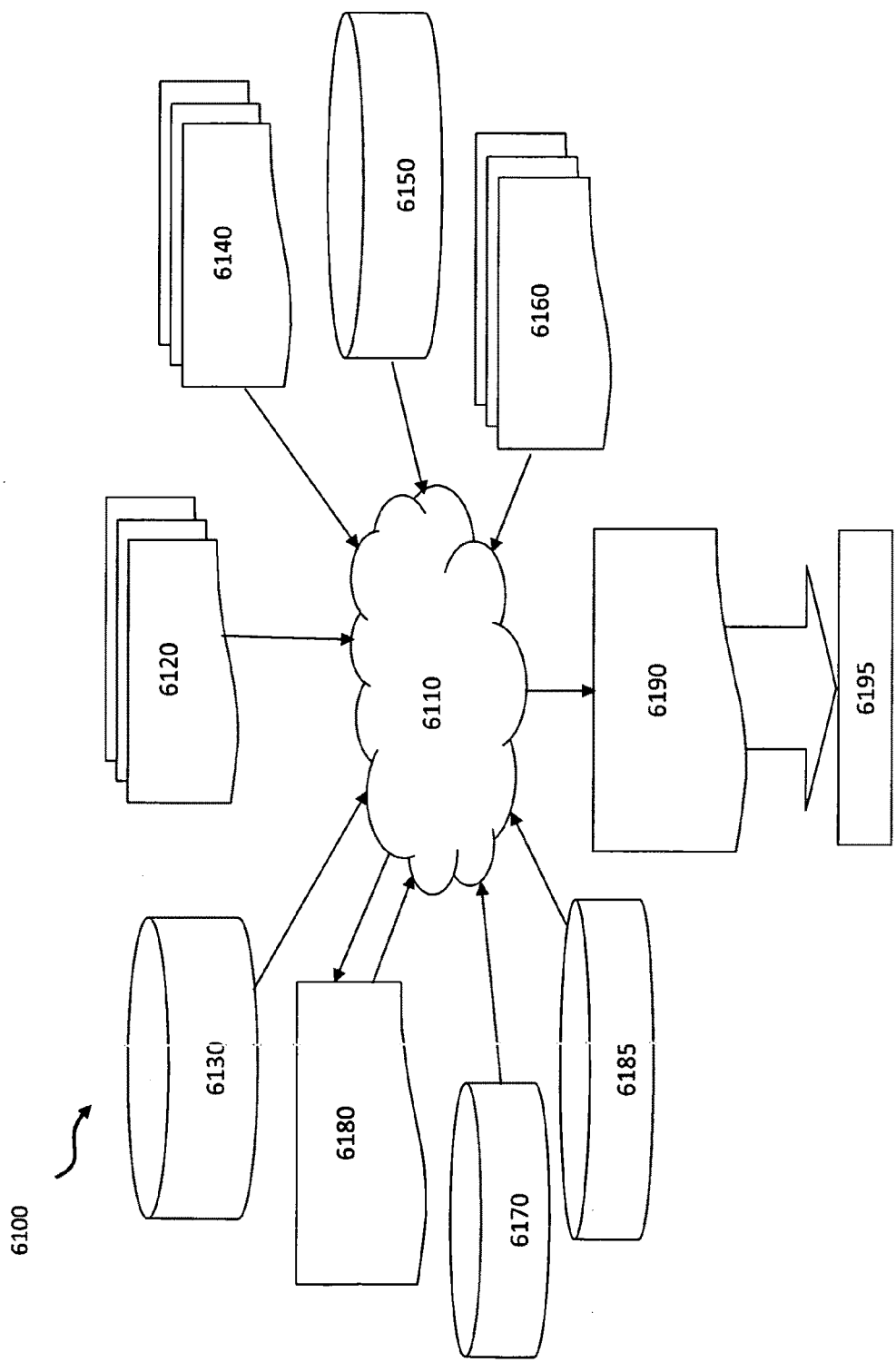
FIG. 61 is a flow diagram of a design process used in semiconductor design, manufacturing, and/or testing.

FIG. 61 shows a block diagram of an exemplary design flow 6100 used for example, in semiconductor design, manufacturing, and/or test. Design flow 6100 may vary depending on the type of IC being designed. For example, a design flow 6100 for building an application specific IC (ASIC) may differ from a design flow 6100 for designing a standard component or from a design from 6100 for instantiating the design into a programmable array, for example a programmable gate array (PGA) or a field programmable gate array (FPGA) offered by Altera® Inc. or Xilinx® Inc. (Altera is a registered trademark of Altera Corporation in the United States, other countries, or both. Xilinx is a registered trademark of Xilinx, Inc. in the United States, other countries, or both.) Design structure 6120 is preferably an input to a design process 6110 and may come from an IP provider, a core developer, or other design company or may be generated by the operator of the design flow, or from other sources. Design structure 6120 comprises an embodiment of the invention as shown in FIGS. 1-24, 26-40, 44, 53, 54, 57 and 58 in the form of schematics or HDL, a hardware-description language (e.g., VERILOG®, Very High Speed Integrated Circuit (VHSIC) Hardware Description Language (VHDL), C, etc.). (VERILOG is a registered trademark of Cadence Design Systems, Inc. in the United States, other countries, or both.) Design structure 6120 may be contained on one or more machine readable medium. For example, design structure 6120 may be a text file or a graphical representation of an embodiment of the invention as shown in FIGS. 1-24, 26-40, 44, 53, 54, 57 and 58. Design process 6110 preferably synthesizes (or translates) an embodiment of the invention as shown in FIGS. 1-24, 26-40, 44, 53, 54, 57 and 58 into a netlist 6180, where netlist 6180 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 6180 is resynthesized one or more times depending on design specifications and parameters for the circuit.

Design process 6110 may include using a variety of inputs; for example, inputs from library elements 6130 which may house a set of commonly used elements, circuits, and devices, including models, layouts, and symbolic representations, for a given manufacturing technology (e.g., different technology nodes, 32 nm, 45 nm, 90 nm, etc.), design specifications 6140, characterization data 6150, verification data 6160, design rules 6170, and test data files 6185 (which may include test patterns and other testing information). Design process 6110 may further include, for example, standard circuit design processes such as timing analysis, verification, design rule checking, place and route operations, etc. One of ordinary skill in the art of integrated circuit design can appreciate the extent of possible electronic design automation tools and applications used in design process 6110 without deviating from the scope and spirit of the invention. The design structure of the invention is not limited to any specific design flow.

Design process 6110 preferably translates an embodiment of the invention as shown in FIGS. 1-24, 26-40, 44, 53, 54, 57 and 58, along with any additional integrated circuit design or data (if applicable), into a second design structure 6190. Design structure 6190 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 6190 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-24, 26-40, 44, 53, 54, 57 and 58. Design structure 6190 may then proceed to a stage 6195 where, for example, design structure 6190: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method of making an integrated circuit (IC) packaging structure, comprising:
   forming at least one polyimide layer;
   etching the at least one polyimide layer to provide a via to a metal pad and at least one supporting shoulder;
   forming a ball limited metallization (BLM) layer within the via and at least in contact with the metal pad and portions of the at least one polyimide layer; and
   forming a controlled collapse chip connection (C4) solder ball on the BLM layer such that the C4 solder ball is supported by the at least one supporting shoulder.

2. The method of claim 1, wherein the C4 solder ball is supported by the at least one supporting shoulder through direct contact with the at least one supporting shoulder.

3. The method of claim 1, wherein the BLM layer is additionally in contact with the at least one supporting shoulder and the C4 solder ball is supported by the at least one supporting shoulder through direct contact with the BLM layer at the at least one supporting shoulder.

4. The method of claim 1, wherein the etching the at least one polyimide layer comprises at least one of:
   using a greytone etching process;
   forming a contoured polyimide layer having the at least one supporting shoulder;
   forming an extended polyimide layer having the at least one supporting shoulder; and
   etching at least two polyimide layers to form the at least one supporting shoulder.

5. The method of claim 1, further comprising:
   forming a layer on the at least one polyimide layer, wherein the layer has a higher modulus of elasticity than the at least one polyimide layer; and
   etching the layer to provide the via to the metal pad and the at least one supporting shoulder.

6. The method of claim 1, wherein the etching is a reactive ion etching (RIE) process.

7. The method of claim 6, further comprising;
   forming a silicon-on-glass (SOG) block;
   forming the metal pad on the SOG block; and
   removing the SOG block beneath the metal pad, by a wet etching process.

8. The method of claim 1, wherein the BLM layer is non-encapsulated and is fully in contact with a surface of the shoulder structure and the metal pad.

9. The method of claim 8, wherein the at least one supporting shoulder is structured in a stepped configuration.

10. The method of claim 9, wherein the at least one supporting shoulder comprises a surface formed between two adjacent inclined surfaces.

11. The method of claim 10, wherein the etching the at least one polyimide layer comprises a tapered exposure process.

12. The method of claim 11, wherein the C4 solder ball fully contacts the surface of the BLM layer.

\* \* \* \* \*